(12) United States Patent
Kishi et al.

(10) Patent No.: US 6,730,949 B2
(45) Date of Patent: May 4, 2004

(54) MAGNETORESISTANCE EFFECT DEVICE

(75) Inventors: Tatsuya Kishi, Kanagawa-Ken (JP);
Minoru Amano, Kanagawa-Ken (JP);
Yoshiaki Saito, Kanagawa-Ken (JP);
Shigeki Takahashi, Kanagawa-Ken (JP); Kentaro Nakajima, Tokyo (JP);
Masayuki Sagoi, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 10/102,944

(22) Filed: Mar. 22, 2002

(65) Prior Publication Data

US 2002/0191451 A1 Dec. 19, 2002

(30) Foreign Application Priority Data

Mar. 22, 2001 (JP) ..................... 2001-082107
Mar. 22, 2001 (JP) ..................... 2001-083877

(51) Int. Cl.⁷ .............................. H01L 29/72
(52) U.S. Cl. ............... 257/295; 257/298; 257/301; 365/158; 365/171; 365/173
(58) Field of Search ................. 257/295, 298, 257/301, 296; 365/158, 171, 173

(56) References Cited

U.S. PATENT DOCUMENTS 5,953,248 A * 9/1999 Chen et al. ............. 257/295
5,959,880 A    9/1999 Shi et al.
5,966,012 A   10/1999 Parkin

OTHER PUBLICATIONS

U.S. patent application Ser. No. 10/102,944, filed Mar. 22, 2002, pending.

U.S. patent application Ser. No. 10/233,505, filed Sep. 4, 2002, pending.

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A magnetoresistance effect devices having a magnetization free layer free to rotate in an applied magnetic field. The magnetization free layer may include first and second ferromagnetic material layers with a nonmagnetic material layer disposed between the two ferromagnetic material layers. Those ferromagnetic materials are antiferromagnetically coupled with each other at a magnetic coupling field J ($-3$ [kOe]$\leq$J$<$0 [kOe]) or ferromagnetically coupled with each other. Alternatively, the magnetization free film includes a first ferromagnetic material layer including a center region having a first magnetization and edge regions having a second magnetization different from the first magnetization and a second ferromagnetic material layer including a center region having a third magnetization parallel to the first magnetization and edge regions having a fourth magnetization different from the third magnetization. In another embodiment, a roughness at an interface between the first ferromagnetic material layer and the first nonmagnetic material coupling layer or an interface between the first second ferromagnetic material layer and the first nonmagnetic material coupling layer is more than 2 angstroms. Also, the magnetization free layer may be formed of ferromagnetic material portions ferromagnetically coupled to each other, or of a nonmagnetic material layer and a first ferromagnetic material layer having a non-uniform film thickness.

30 Claims, 18 Drawing Sheets

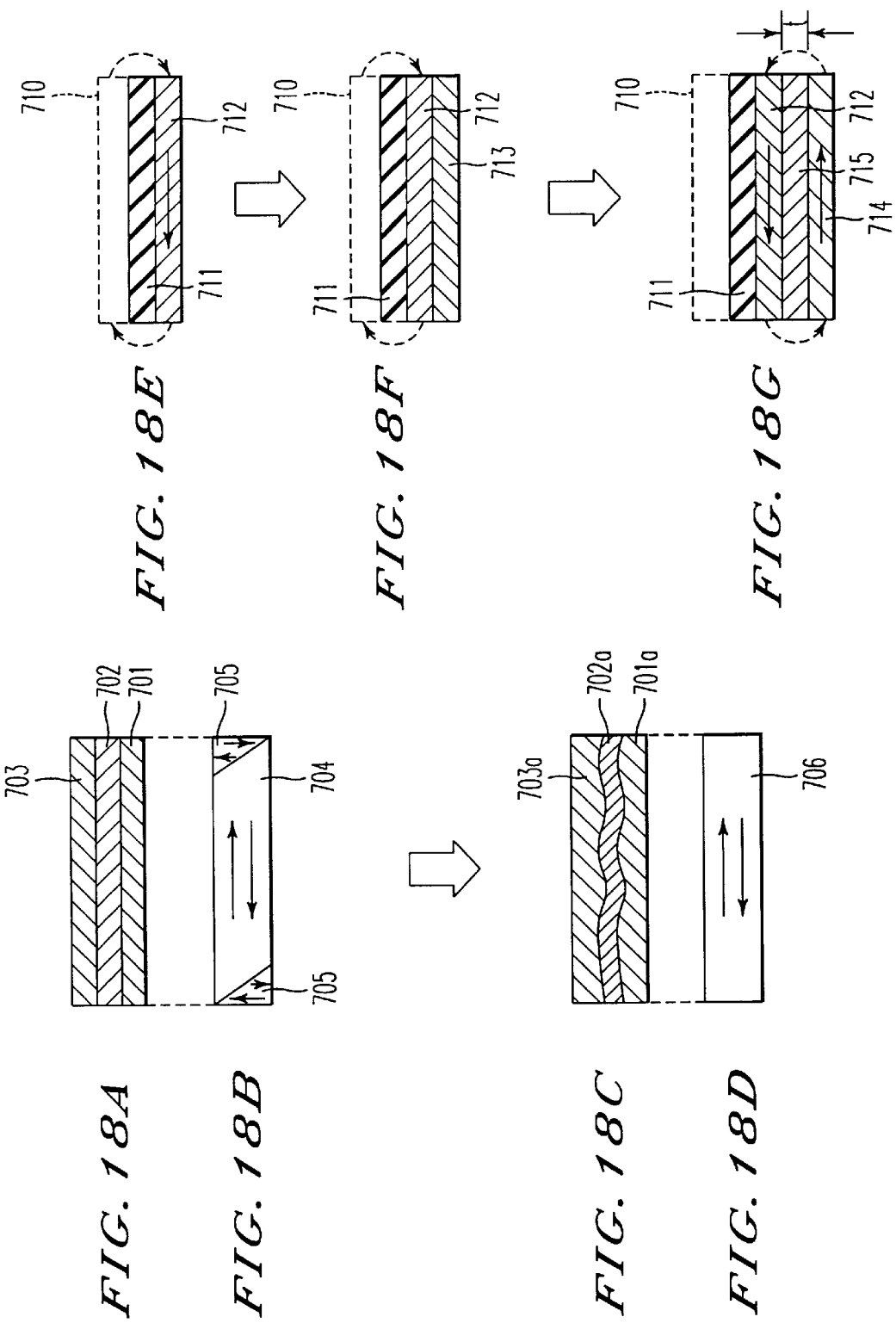

MAGNETORESISTANCE EFFECT DEVICE

CROSS-REFERENCE TO RELATED APPLICATIONS

This application claims the benefit of priority from Japanese Patent Applications Nos. 2001-082107 and 2001-083877, filed on Mar. 22, 2001, the entire contents of which are incorporated herein by reference.

BACKGROUND OF THE INVENTION

1. Field of the Invention

The present invention relates to a magnetoresistance effect device including first and second ferromagnetic material layers, whose magnetization directions change under an applied magnetic field, and a non-magnetic material layer inserted between the first and the second ferromagnetic material layers.

2. Discussion of the Background

A Tunnel MagnetoResistance or a Tunnel MagnetoResistive (TMR) device basically includes a three-layered film of a first ferromagnetic material layer, a dielectric material layer formed on the first ferromagnetic material layer, and a second ferromagnetic material layer formed on the dielectric material layer. A tunnel junction is formed and tunnel current flows between the first and the second ferromagnetic material layers via the dielectric material layer by applying voltage to both the ferromagnetic material layers. The tunnel junction's electrical resistance changes in proportion to cosine of relative angle of magnetization directions of the first and the second ferromagnetic material layers. The junction resistance takes a minimum value when magnetizations of the first and the second ferromagnetic material layers are substantially in parallel and a maximum value when the magnetizations of the first and the second ferromagnetic material layers are substantially anti-parallel. Such a change in the resistance is referred to as a Tunnel MagnetoResistance (TMR) effect and the device utilizing the TMR effect is called a TMR device.

It is reported that the change in the resistance by the TMR effect is as large as 49.7% at room temperature (Appl. Phys. Lett. 77, 283 (2000)).

A TMR device can be used as a memory cell of a memory device, such as a magnetic random access memory (MRAM) of magnetic information.

One of the first and second ferromagnetic material layers may usually have a fixed or pinned magnetization in a predetermined direction and the fixed magnetization does not rotate/invert even when a magnetic field is applied. Another one of the first and second ferromagnetic material layers has a magnetization free to rotate/invert under the applied magnetic field, referred as a magnetization free layer. When the TMR device is applied to a memory device, such as the MRAM, the ferromagnetic material layer having the magnetization free to rotate/invert may also be referred to as a memory layer, because it retains in memory written magnetic information as a state of magnetization of the magnetization free layer, while the ferromagnetic material layer having a pinned magnetization may be referred as a reference layer.

By corresponding each state of parallel and anti-parallel directions of magnetization of the reference layer and the memory layer to the binary information of "0" or "1," a TMR device can be used as the memory device.

Writing of the magnetic information can be achieved by providing an electrical current flow to a conductive line formed at a vicinity of the memory cell and inverting magnetization of the memory layer by a magnetic field generated by the electrical current.

The written magnetic information can be read by flowing tunnel current as a sense current to the TMR device and current detector or a voltage detector can sense the electrical resistance of the TMR device.

An integrated magnetic memory apparatus includes a number of memory cells each having the TMR device and a switching transistor, which is coupled to the respective TMR device of the same memory cell, and with a large number of memory cells aligned in a matrix. An arbitrary cell can be selected in known methods, for example, as employed in DRAM addressing. The integrated magnetic memory apparatus also includes bit lines extended in row directions and word lines extended in column directions. Each of the bit lines is coupled to a series of memory cells which are aligned in the same direction as the bit line extends. Each of the word lines is also coupled to a series of the memory cells aligned in the same direction as the word line extends. Peripheral circuits for controlling current or voltage of the bit and word lines are also provided at ends in row and column directions of the memory cell region.

A memory apparatus having the TMR devices and diodes in place of the switching transistors has also been reported (U.S. Pat. Nos. 5,640,343 and 5,650,958).

It is necessary to reduce the memory cell region for a highly integrated magnetic memory apparatus. Therefore, an area of ferromagnetic material layer is necessarily reduced, however, when the area of the ferromagnetic material layer is reduced, its coercive force increases. A magnitude of a switching magnetic field that is necessary for inversion of magnetization of the memory layer increases as the coercive force increases, and accordingly, a reduction in the plan area results to an increase in the switching magnetic field. In writing magnetic information, larger current flow is needed to write information with the increased switching magnetic filed, whereby power consumption of the apparatus increases. Therefore, the reduction in the coercive force of the memory layer is important in reducing the highly integrated magnetic memory apparatus into practice.

A multi-layered memory film is proposed in order to resolve the large power consumption. The multi-layered memory film including two ferromagnetic material layers and a nonmagnetic layer formed between the two ferromagnetic material layers, in which the two ferromagnetic material layers are antiferromagnetically coupled (Japanese Patent Laid-Open No. 9-251621, U.S. Pat. No. 5,953,248).

The two ferromagnetic material layers of multi-layered film differ from each other in magnetic moment or thickness. Directions of magnetization of the ferromagnetic material layers are in opposite directions by the antiferromagnetic interlayer coupling. Therefore, the magnetizations of the two ferromagnetic material layers are cancelled and the multi-layered film as a whole can be regarded as one ferromagnetic material layer having a small amount of magnetization.

When a magnetic field directed opposite to the direction of the magnetization of the multi-layered film is applied, magnetization of the two ferromagnetic material layers invert, while maintaining the antiferromagnetic coupling. In this case, its small coercive force determines a switching magnetic field of multi-layered film and inversion of magnetization can be carried out by a small amount of switching magnetic field. While having such advantage, the multi-layered film fabricated into a very small size for a highly integrated magnetic memory apparatus exhibits an effect of enlargement of "edge magnetic domain" such that a change in a magnetic structure pattern during magnetization inversion becomes complicated. As a result, the coercive force and the switching magnetic field increase. The edge domain appears as a magnetic structure, when a width of a short axis of small ferromagnetic material layer becomes about several micrometers to sub micrometer, at film end portions of a magnetic material layer owing to influence of a demagnetization field (J. App. Phys. 81, 5471 (1997)).

To prevent generation of edge domains, a method of fixing magnetization of the edge domain was proposed (U.S. Pat. No. 5,748,524, and Japanese Patent Laid-Open No. 2000-100153).

When magnetization of an edge domain is fixed, a behavior in magnetization inversion can be controlled. However, it becomes difficult to reduce the switching magnetic field. A new composition added to fix the magnetization for preventing the edge domains is not suitable for high-density integration.

SUMMARY OF THE INVENTION

A first object of the present invention is to provide a magnetoresistance effect device having a stable magnetization structure of a magnetic layer having a magnetization free to rotate/invert achieved by a simple device structure.

A second object of the embodiments of the present invention is to provide a magnetic memory apparatus, a portable terminal apparatus, a magnetoresistance effect head or a magnetoresistive head, and a magnetic reproducing apparatus or a magnetic recording and reproducing apparatus having the stable magnetization structure of a magnetic layer having the magnetization free to rotate/invert achieved by a simple device structure.

An third object of the present invention is to provide a magnetic memory apparatus, a portable terminal apparatus, such as personal digital assistant, a magnetoresistance effect head, and a magnetic reproducing apparatus including the magnetoresistance effect device.

According to a first aspect of the present invention, there is provided a magnetoresistance effect device including a first ferromagnetic material layer having a magnetization free to change in an applied magnetic field, a first nonmagnetic material coupling layer formed on the first ferromagnetic material layer, a second ferromagnetic material layer formed on the first nonmagnetic material layer and having a magnetization free to change in the applied magnetic field, a first nonmagnetic material spacer layer formed on the second ferromagnetic material layer, and a third ferromagnetic material layer formed on the first nonmagnetic material spacer layer and having a magnetization substantially fixed in the applied magnetic field. The first and the second ferromagnetic material layers are antiferromagnetically coupled at a magnetic coupling field J, where the magnetic coupling field J satisfies following equation, −3 [kOe]≦J<0 [kOe].

According to a second aspect of the present invention, there is provided a magnetoresistance effect device including a first ferromagnetic material layer having a magnetization free to change in an applied magnetic field, a first nonmagnetic material coupling layer formed on the first ferromagnetic material layer, a second ferromagnetic material layer formed on the first nonmagnetic material layer and having a magnetization free to change in the applied magnetic field, a first nonmagnetic material spacer layer formed on the second ferromagnetic material layer; and a third ferromagnetic material layer formed on the first nonmagnetic material spacer layer and having a magnetization substantially fixed in the applied magnetic field, wherein the first and the second ferromagnetic material layers are ferromagnetically coupled.

In the first and the second aspects of the embodiments of the present invention, a magnitude J of magnetic coupling is synonymous to interlayer coupling magnetic field and the value can be calculated by Equation (1) shown below.

$$J = -H_s \times M_s \times t / 4 \quad (1)$$

where Hs designates a saturated magnetic field (in Oe) of a magnetization free layer including the first and second ferromagnetic material layers and the nonmagnetic material coupling layer, Ms designates a saturated magnetization (in Oe) of the magnetization free layer and notation t designates a thickness (in nm) of the magnetization free layer. The saturated magnetic field Hs can be obtained by hysteresis of a magnetoresistance effect device. Values by the respective factors are provided by measuring materials and compositions of the first and the second ferromagnetic material layers and the nonmagnetic coupling layer from a cross-section of the device. Specification of the magnitude J of the magnetic coupling and the magnetic structure is not limited to these methods but can be specified also by other methods.

According to a third aspect of the present invention, there is provided a magnetoresistance effect device including a first ferromagnetic material layer including a center region of a first magnetization free to change in an applied magnetic field and edge regions of a second magnetization different from the first magnetization and being free to change in the applied magnetic field, a first nonmagnetic material coupling layer disposed on the first ferromagnetic material layer, a second ferromagnetic material layer disposed on the first nonmagnetic material coupling layer and including a center region of a third magnetization parallel to the first magnetization and free to change in the applied magnetic field and edge regions of a fourth magnetization different from the third magnetization and being free to rotate in the applied magnetic field, a first nonmagnetic material spacer layer formed on the second ferromagnetic material layer; and a third ferromagnetic material layer disposed on the first nonmagnetic material spacer layer and having a magnetization substantially fixed in an applied magnetic field.

In the third aspect of the present invention, the magnetic structure of the first and the third ferromagnetic material layers may be detected by MFM (magnetic force microscope) or a spin resolved SEM (scanning electron microscope) by exposing the first and the second ferromagnetic material layers.

According to a fourth aspect of the present invention, there is provided a magnetoresistance effect device including a first ferromagnetic material layer having a magnetization free to change in an applied magnetic field, a first nonmagnetic material coupling layer formed on the first ferromagnetic material layer, a second ferromagnetic material layer formed on the first nonmagnetic material layer and having a magnetization free to change in the applied magnetic field, a first nonmagnetic material spacer layer formed on the second ferromagnetic material layer, and a third ferromagnetic material layer formed on the first nonmagnetic material spacer layer and having a magnetization substantially fixed in the applied magnetic field. There is a roughness at an interface between the first ferromagnetic material layer and the first nonmagnetic material coupling layer or an interface between the second ferromagnetic material layer and the first nonmagnetic material coupling layer, and the roughness at the interface is more than 2 angstroms.

In the first through fourth aspects of the present invention, the third ferromagnetic material layer is a fixed magnetization layer in which the direction of magnetization substantially remains unchanged in an applied magnetic field, while the applied magnetic field can change the magnetizations of the first and the second ferromagnetic material layers.

According to the first through fourth aspects of the present invention, the switching magnetic field can be reduced. When invert magnetic field is applied to the magnetization free layers (first and second ferromagnetic material layers), the magnetization directions thereof are changed by the applied magnetic field. The applied magnetic field may be applied in parallel to or inclined to the direction of an easy magnetization axis of the magnetization free layers. The magnetization directions are inverted when magnetic coupling energy between the first and the second ferromagnetic material layers is reduced, therefore the switching magnetic field for switching the magnetization of the two layers can be reduced.

Further, the magnetization structure of the first and the second ferromagnetic material layers can be substantially symmetric with respect to a magnetic axis, and the magnetization structure differs from an apparatus characterized in non-symmetry magnetic structure disclosed in Japanese Patent Laid-Open No. 11-273337. As a result of the symmetrical structure, a reduction in magnetoresistance accompanied by magnetization inversion is relatively small, which is desirable for the magnetoresistance effect device.

According to a fifth aspect of the present invention, there is provided a magnetoresistance effect device including a magnetization free layer having a nonmagnetic material layer and ferromagnetic material portions, a nonmagnetic material spacer layer disposed on the magnetization free layer and a ferromagnetic material layer disposed on the nonmagnetic material spacer layer and having a magnetization substantially fixed in an applied magnetic field. The magnetization free layer has a magnetization free to change in the applied magnetic field and the ferromagnetic material portions are ferromagnetically coupled to each other.

According to a sixth aspect of the present invention, there is provided a magnetoresistance effect device including a magnetization free layer having a plurality of ferromagnetic material portions ferromagnetically coupled to each other and having a magnetization free to change in an applied magnetic field, a nonmagnetic material spacer layer disposed on the magnetization free layer; and a ferromagnetic material layer disposed on the nonmagnetic material spacer layer and having a magnetization substantially fixed in the applied magnetic field.

According to a seventh aspect of the present invention, there is provided a magnetoresistance effect device including a magnetization free layer having a nonmagnetic material layer and a first ferromagnetic material layer and having a magnetization free to change in an applied magnetic field, a nonmagnetic material spacer layer disposed on the magnetization free layer, and a second ferromagnetic material layer disposed on the nonmagnetic material spacer layer and having a magnetization substantially fixed in the applied magnetic field. The first ferromagnetic material layer has a non-uniform film thickness.

An integrated magnetic memory apparatus can be realized by providing a plurality of the same magnetoresistance effect devices mentioned above. The integrated magnetic memory may have a reduced switching magnetic field and may form a random accessible, non-volatile and low power consumption memory apparatus. A portable terminal apparatus, such as a portable telephone and a portable display apparatus provided with the magnetic memory apparatus is also useful. The magnetoresistance effect devices, mentioned above, can also be used in a magnetoresistance effect head. A magnetic reproducing apparatus provided with the magnetoresistance effect head is also useful.

BRIEF DESCRIPTION OF THE DRAWINGS

A more complete appreciation of the invention and many of the attendant advantages thereof is readily obtained as the state becomes better understood by reference to the following detailed description when considered in connection with the accompanying drawings:

FIGS. 18A, 18B, 18C, 18D, 18E, 18F, and 18G are cross-sectional and plane views of a magnetization pinned layer and a magnetization free layer of a double tunnel junction magnetoresistance effect device according to a seventh embodiment of the present invention;

DETAILED DESCRIPTION OF THE EMBODIMENTS

In various aspects, the present invention relates to a magnetoresistance effect device, a magnetic memory apparatus, a portable terminal apparatus, such as a Personal Digital Assistant, a magnetoresistance effect head, and a magnetic reproducing apparatus comprising the magnetoresistance effect device.

Figure 1:
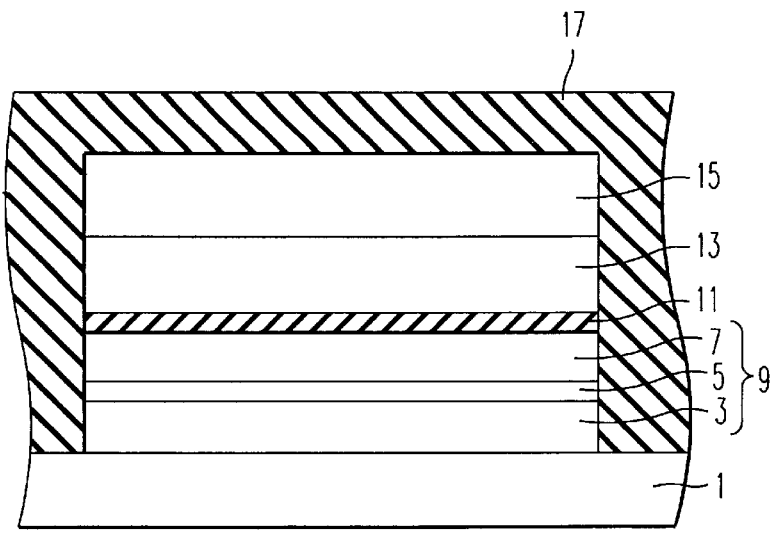
FIG. 1 is a cross-sectional view of a magnetoresistance effect device according to a first embodiment of the present invention.

FIG. 1 is a cross-sectional view of a magnetoresistance effect device according to a first embodiment of the present invention. The magnetoresistance effect device is provided with a first electrode 1 formed on a surface of a substrate (not shown) via an interlayer insulating film (not shown). As the substrate, a semiconductor substrate such as single crystal silicon or its equivalent known in the art can be used for mounting the magnetoresistance effect device and a semiconductor device, such as a transistor or a diode. For a magnetoresistance effect head for reading magnetic information of a magnetic medium, the magnetoresistance effect device can be formed on an $Al_2O_3$ substrate or its equivalents known in the art. For first electrode 1, known conductive materials can be chosen to promote crystalline orientation of ferromagnetic material layers to be formed on an upper surface of the first electrode 1.

A magnetization free film 9 of FIG. 1 is successively formed on the first electrode 1, and includes a first ferromagnetic material layer 3, a nonmagnetic coupling layer 5 and a second ferromagnetic material layer 7. The two ferromagnetic material layers 3 and 7 of the magnetization free film 9 have magnetizations free to rotate/invert under an applied magnetic field, therefore the film 9 is referred to the magnetization free film. The magnetization free film 9 may be referred to as memory film in a memory cell of a magnetic memory apparatus.

A first nonmagnetic dielectric spacer layer 11 and a third ferromagnetic material layer 13 of FIG. 1 are formed on the magnetization free film 9. The ferromagnetic material layer 13 substantially maintains its magnetization under the applied magnetic field. The dielectric spacer layer 11 provides a predetermined distance (space) between the second and the third ferromagnetic material layers 7 and 13. An electrode 15 is formed on the third ferromagnetic layer 13.

Tunnel current flows between the magnetization free film 9 and the third ferromagnetic material layer 13 via the first nonmagnetic dielectric spacer layer 11. A value of the tunnel resistance is proportional to cosine of a relative angle of magnetization directions of the second ferromagnetic material layer 7 and the third ferromagnetic material layer 13. Tunnel resistance takes a minimum value when the magnetization directions of the two layers are substantially parallel to each other and the tunnel resistance takes a maximum value when the magnetization directions are substantially anti-parallel to each other.

Therefore, a change in the resistance of the magnetoresistance effect device in accordance with the change in the magnetization can be read by measuring the tunnel current flow between the first and the third ferromagnetic material layers 3 and 13 through two electrodes 1 and 15 while constant voltage is applied to the magnetoresistance effect device. The resistance of the device can also be measured by the electrical potential difference between the first and the third ferromagnetic material layers 3 and 13 while constant electrical current is provided between them through two electrodes 1 and 15.

The magnetoresistance effect device can be a Giant MagnetoResistance (GMR) effect device, when a conductive material such as Cu, Ag, Au or their equivalent known in the art is used as a nonmagnetic material conductive spacer layer in place of the dielectric spacer layer 11. The GMR device utilizes well-known spin dependent scattering phenomenon at intersurfaces between the ferromagnetic material layers and the nonmagnetic material conductive layer.

The electrical resistance change in the GMR device is also proportional to cosine of the relative angle of magnetization directions of the second ferromagnetic material layer 7 and the third ferromagnetic material layer 13. The resistance takes a minimum value when the magnetization directions between second and third ferromagnetic material layers are parallel to each other and the resistance takes the maximum value when the magnetization directions of the second and third ferromagnetic material layers 7 and 13 are anti-parallel to each other. The variation in the resistance of the magnetoresistance effect device can be read by reading a variation in a current amount when applying constant potential difference between the two ferromagnetic material layers 3 and 13 through electrodes 1 and 15, or by reading a variation in electrical potential difference between the two ferromagnetic material layers 3 and 13 by providing a constant current through the first and the second electrodes 1 and 15.

The first and second electrodes 1 and 15 of the magnetic memory apparatus are provided with respective longitudinal directions so that the both electrodes 1 and 15 intersect with each other at a place where the TMR device is located. The first electrode 1 of FIG. 1 is provided with its longitudinal direction extending to left and right of the sheet surface of FIG. 1 and the second electrode 15 is provided with its longitudinal direction orthogonal to the sheet surface of FIG. 1. An interlayer insulating film 17 for electric insulation is formed between contiguous TMR devices.

Known ferromagnetic material such as Fe, Co and Ni and their equivalents, and an alloy containing one of the Fe, Co, Ni and their equivalents, may be used for the first through third ferromagnetic material layers 3, 7 and 13. A laminated film including these ferromagnetic material layers can also be used as each of the ferromagnetic material layers 3, 7 and 13.

A known nonmagnetic metal material, such as Ru, Au, Ag, Cu, or their equivalents, may be used for the nonmagnetic coupling layer 5.

A known nonmagnetic dielectric material, such as $Al_2O_3$, $SiO_2$ or their equivalents, can be used as the first nonmagnetic dielectric spacer layer 11.

A planar shape of the magnetoresistance effect device may be parallelogram, rhombus or a polygon having corners equal to or more than that of pentagon other than regular parallelepiped. There may be provided an elliptic end. Among these, parallelogram as well as rhombus shapes are simpler and more convenient in view of fabrication than other shapes and are effective in reducing the switching magnetic field.

EXAMPLE 1

An explanation will be given of a relationship between a coupling magnetic field J (Oe) of the first and the second ferromagnetic material layers and a switching magnetic field (Oe) of the magnetization free film of a first example of the first embodiment. The magnetization free film 9 of the first example is formed above a thermally oxidized silicon substrate by sputtering. A $Co_9Fe_1$ sputter target is used for the first and the second ferromagnetic material layers 3 and 7 and a Ru sputter target is used for the nonmagnetic coupling layer 5.

The magnetization free film 9 in this example has a regular parallelepiped plane having a designed width of about 0.1 micrometer and an aspect ratio of about 1:4. The average thickness of the first and the second ferromagnetic material layers is equal to and about 2.0 nm. The average thickness can be measured at 10 arbitrary locations over a width of about 10 nm in a sectional image taken with a Transmission Electron Microscope (TEM). A sputtering rate and time may also suggest a design thickness of the layer to be treated as the average thickness.

Figure 2:
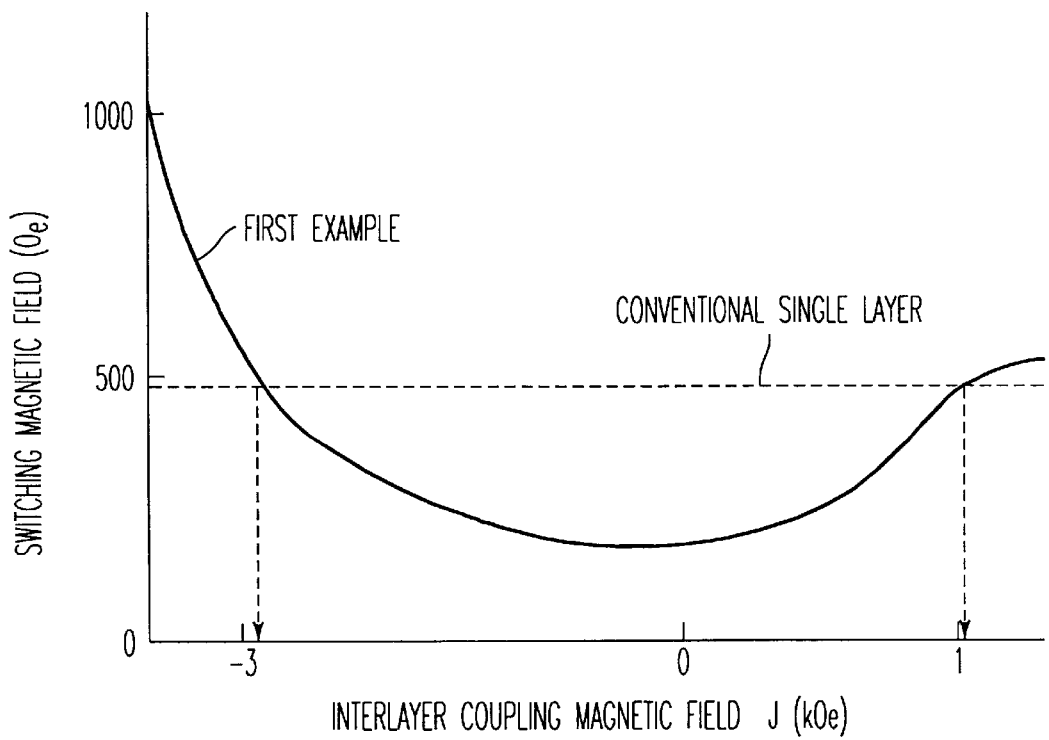
FIG. 2 is a graph of a magnetic characteristic according to an example of the first embodiment of the present invention in comparison with a conventional single layer.

As shown by a bold line of FIG. 2, the switching magnetic field necessary for magnetization inversion of the first and the second ferromagnetic material layers 3 and 7 to achieve change of memory status of the magnetization free film 9 is extremely reduced in a range equal to or larger than −3 (k Oe) and equal to or smaller than 1 (k Oe). Particularly, the interlayer coupling magnetic field J is preferably equal to or larger than −3 (k Oe) and equal to or lower than 0.1 (k Oe) as described in Example 2. According to the magnetoresistance effect device having such a magnetization free film 9, the switching magnetic field can be reduced.

When the interlayer coupling magnetic field J (Oe) is not present (J=0 (k Oe)), the interlayer coupling is not substantially present between the first and the second ferromagnetic material layers 3 and 7 and only magnetostatic coupling is present between them.

A broken line of FIG. 2 shows comparative example of switching magnetic field of a conventional magnetization free layer. The comparative example is a single layer of a ferromagnetic material $Co_9Fe_1$ having a thickness of about 2.0 nm, a width of about 0.1 micrometer and an aspect ratio of about 1:4.

EXAMPLE 2

Figure 3:
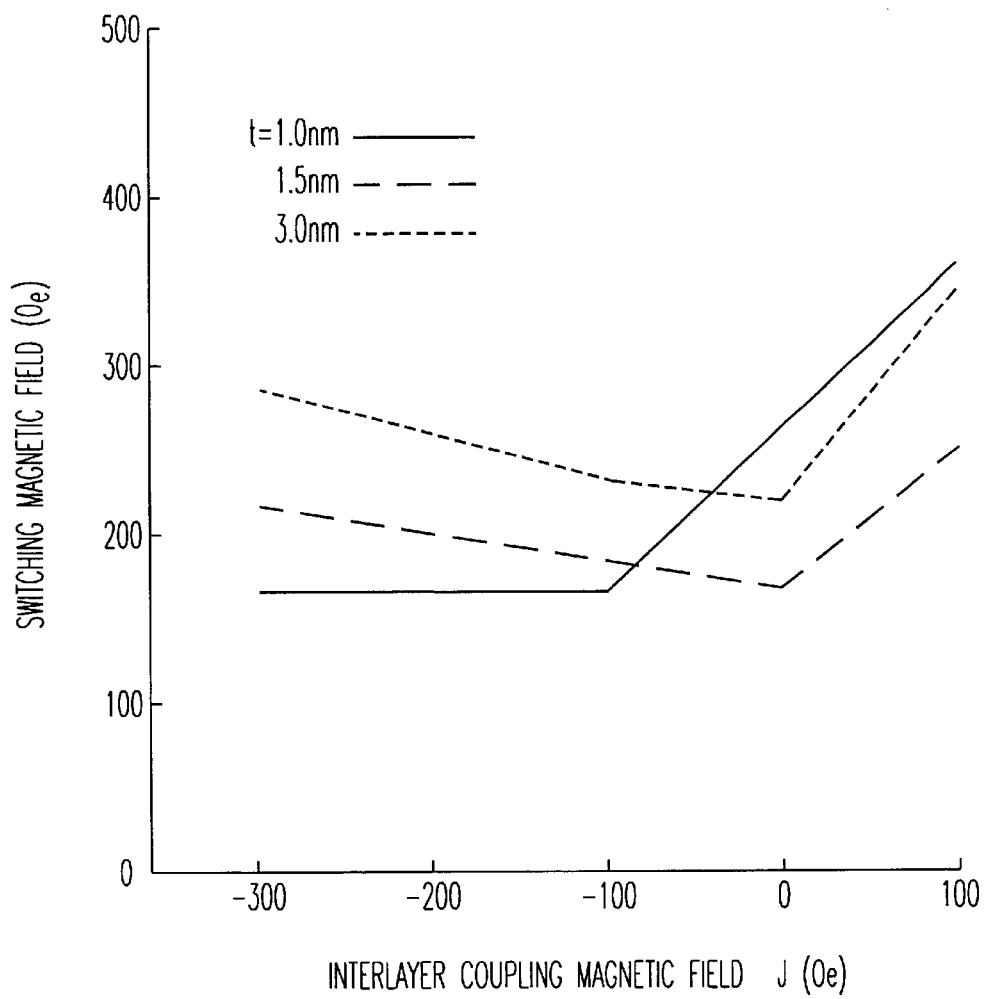
FIG. 3 is a graph of a magnetic characteristic according to a second example of the first embodiment of the present invention.

FIG. 3 is a graph of a magnetic characteristic according to second example of the first embodiment of the present invention.

In the second example, the average thickness t of the first and the second ferromagnetic material layers 3 and 7 is changed respectively as 1.0 nm, 1.5 nm and 3.0 nm. Shape of the film and materials used in the first and the second ferromagnetic material layers 3 and 7 and the nonmagnetic coupling layer 5 are same as those of Example 1. The minimum value of the switching magnetic field of the magnetization free films 9 having the first and the second ferromagnetic material layers 3 and 7 of about 1.5 nm and about 3.0 nm appears when the interlayer coupling magnetic field J is at a vicinity of zero (Oe).

When the average thickness t of the two ferromagnetic material layers are about 1.0 nm, the coercive force is provided with a sufficiently small value from −100 (Oe) to −300 (Oe). Therefore, in order to achieve reduction in the switching magnetic field, it is preferable that the magnetic field J of the interlayer coupling falls in a range between −300 (Oe) and −100 (Oe).

When the interlayer coupling magnetic field J is lower than −100 (Oe), the switching magnetic field of magnetization free film having the two ferromagnetic material layers of thickness of 1.0 nm is smaller than the switching magnetic field of magnetization free films having the two ferromagnetic material layers of thickness of 2.0 nm and 3.0 nm. The ferromagnetic material layers may have an average thickness of not less than 0.1 nanometer and not more than 100 nanometers.

Figure 4A:
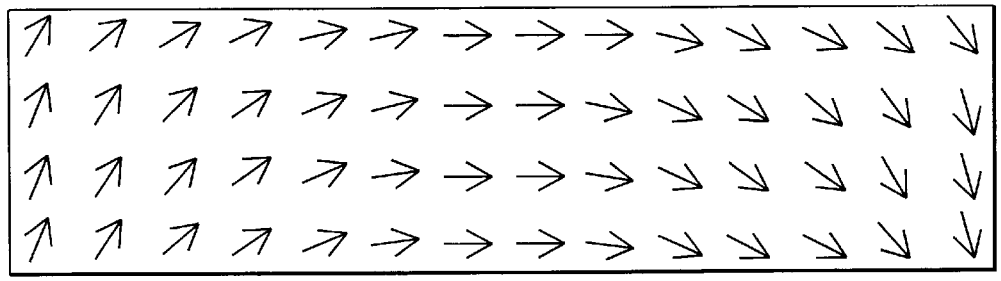
FIGS. 4A and 4B are plan views and illustrating magnetic structures of first and second ferromagnetic material layers according to the second example of the first embodiment of the present invention.
Figure 4B:
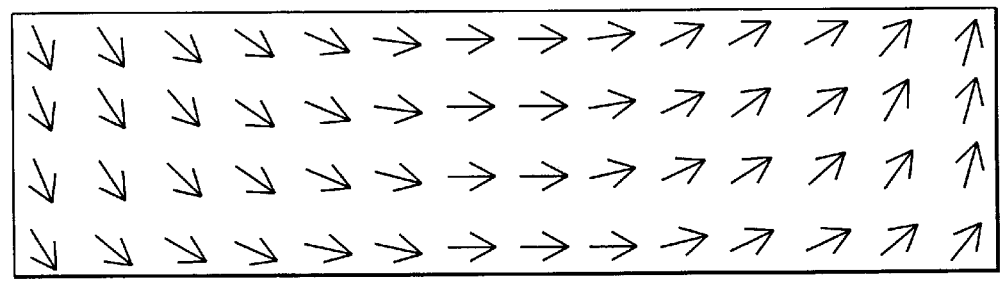

FIG. 4A is a plan view of a magnetic structure of one of the first and the second ferromagnetic material layers 3 and 7 and FIG. 4B is a plan view of a magnetic structure of another of the ferromagnetic material layers 3 and 7.

Directions of magnetization of central regions of the first and the second ferromagnetic material layers 3 and 7 of FIG. 4A and FIG. 4B are substantially equal to each other, whereby those central regions have a substantially parallel magnetic axis. On the other hand, magnetization directions of both end regions of the first and the second ferromagnetic material layers differ from the magnetization directions of the central regions and there are substantial angles (not zero degree) between magnetization directions of the two ferromagnetic material layers at end regions.

Such magnetic structures are produced as a result of conflict of an interlayer coupling of the magnetization free film, a magneto static coupling of the two ferromagnetic material layers and a magnetic anisotropy of the two ferromagnetic material layers. The magnetization of the magnetization free film 9 as a whole is stable, whereby the switching magnetic field may be reduced and current necessary for inversion of magnetization of the magnetization free layer can be reduced.

Each magnetic structure of the first and the second ferromagnetic material layers of FIGS. 4A and 4B has a structure similar to a "C" and the structure can be referred to as a C type magnetic structure. When magnetization directions at two end portions of a ferromagnetic material layer have parallel relation, the magnetization structure is similar to "S", and the structure can be referred to as an S type magnetic structure.

Although the size of the device is not specifically defined, the width of the magnetization free film of the embodiments of the present invention can have a large size but may be preferably smaller than about 1 micrometer and the aspect ratio preferably falls in a range of about 1:1.5 through 1:10. Further, the average thickness of the ferromagnetic material layers of the present embodiment is preferably equal to or smaller than 10 nm, more preferably equal to or smaller than 5 nm.

EXAMPLE 3

Figure 5:
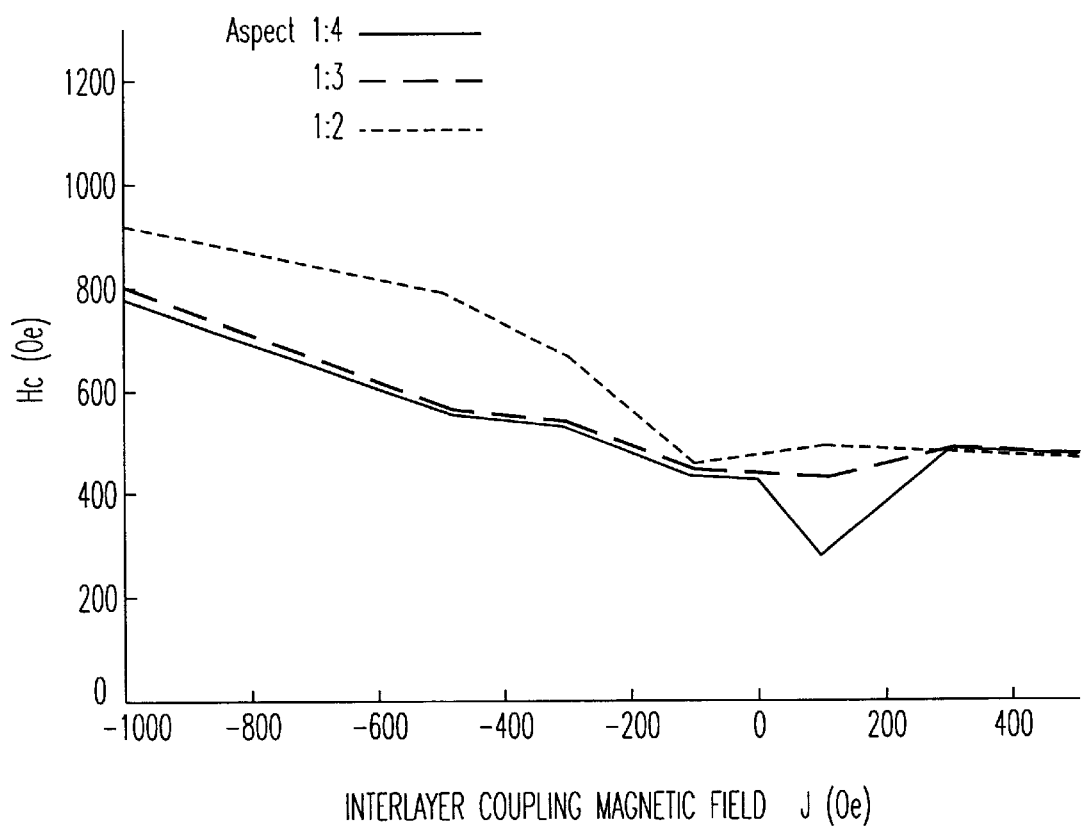
FIG. 5 is a graph of a magnetic characteristic according to a third example of the first embodiment of the present invention.

The magnetization free film 9 can be changed in its aspect ratio. FIG. 5 is a graph of a magnetic characteristic showing a relationship between the interlayer coupling magnetic field J (Oe) and coercive force Hc (Oe) of the magnetization free film 9. The average thickness of the first ferromagnetic material layer 3 is about 3.0 nm and the average thickness of the second ferromagnetic material layer 7 is about 2.0 nm. Respective lines of FIG. 5 show examples of the magnetization free film 9 having the aspect ratios of 1:2, 1:3 and 1:4.

Materials, its compositions and widths used in the first and the second ferromagnetic material layers 3 and 7 and the nonmagnetic coupling layer 5 of the example are the same as those of Example 1.

The coercive force Hc of FIG. 5 is minimized in the ferromagnetic coupling (J>0) when the aspect ratio of the magnetization free film 9 is larger than 1:2. In the case of the aspect ratio of 1:4, with regard to the magnitude of the interlayer coupling, the coercive force is rapidly reduced at a vicinity of 100 (Oe).

The magnitude of coupling between the first and the second ferromagnetic material layers 3 and 7 of the third example preferably falls in a range not less than −500 (Oe) and not more than 300 (Oe).

Figure 6A:
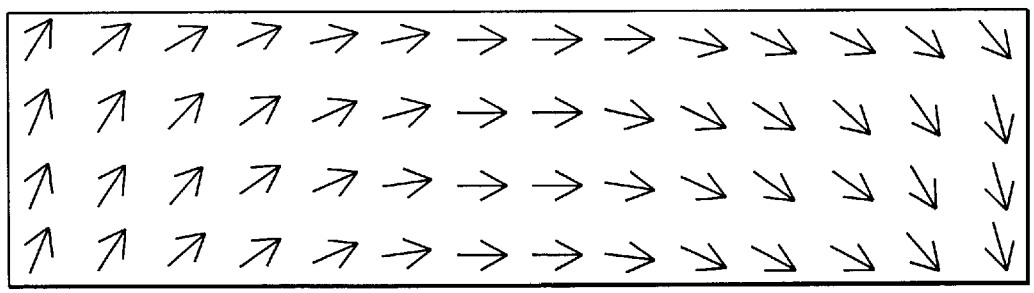
FIGS. 6A and 6B are plan views of magnetic structure of first and second ferromagnetic material layers according to the third example of the first embodiment of the present invention.
Figure 6B:
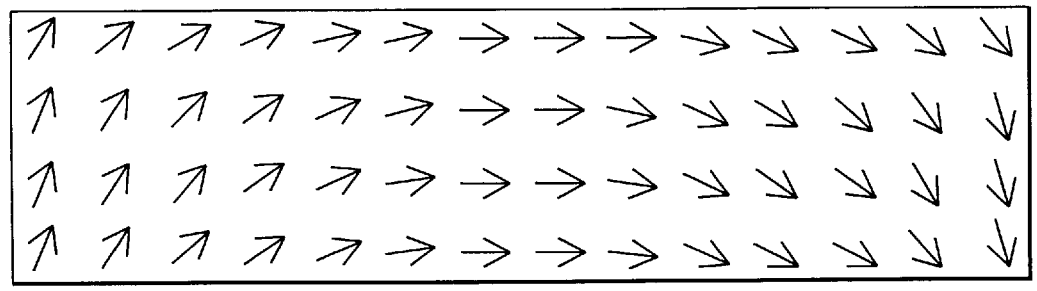

Magnetic structure of the first and the second ferromagnetic material layers 3 and 7 of the third example in which the interlayer coupling magnetic field J is about 100 (Oe), is shown in plane views of FIGS. 6A and 6B. FIG. 6A is a plan view of a magnetic structure in the surface in one of the first and the second ferromagnetic material layers 3 and 7 and FIG. 6B is a plan view of a magnetic structure in the surface of the other.

Direction of magnetizations of central regions of the first and the second ferromagnetic material layers of FIG. 6A and FIG. 6B are in parallel with each other in the same direction. Directions of magnetization at end regions thereof are in the same direction in the first and the second ferromagnetic material layers 3 and 7. Magnetic structures in the respective ferromagnetic material layers 3 and 7 of FIGS. 6A and 6B are the "C" type structure. The above-described "S" type structure may also be applied.

EXAMPLE 4

Example 4 focuses on variation of materials and average thickness of the first and the second ferromagnetic material layers 3 and 7 and the nonmagnetic coupling layer 5 in the magnetization free film 9.

The data of the following Table 1 shows material and layer thickness of the first and the second ferromagnetic material layers 3 and 7 and a range of the average thickness of each material of the nonmagnetic coupling layer 5 to provide the antiferromagnetic coupling between the first and the second ferromagnetic material layers 3 and 7 according to the embodiment of the present invention. Any of the layers was formed by a sputtering method by using the material shown in the table as a target.

second ferromagnetic material layers is weakened and the corresponding column is made vacant.

EXAMPLE 5

Example 5 focuses on a method of forming the magnetization free film 9 of the first embodiment.

A layer of $Co_9Fe_1$ was formed as the first ferromagnetic material layer 3 using $Co_9Fe_1$ sputtering target. A laminate film including $Co_9Fe_1$, NiFe and $Co_9Fe_1$ layers could be used as the ferromagnetic material layer 3. The thickness of the first ferromagnetic material layer 3 was 1.5 nm. A Ru layer for the nonmagnetic coupling layer 5 was formed above the first ferromagnetic material layer 3 by using an Ru target. The second ferromagnetic material layer 7 having a thickness of 1.5 nm was formed by a sputtering method by using the target having the same material and composition as those of the first ferromagnetic material layer 3.

Kinds of magnetic couplings, namely ferromagnetic or antiferromagnetic, and magnitude of the interlayer coupling created between the first and the second ferromagnetic material layers 3 and 7 can be controlled by changing the thickness of the nonmagnetic coupling layer 5.

Cu, Au, Ag or their equivalents may also be used as a material of the nonmagnetic coupling layer. It is preferable to set the average thickness of the nonmagnetic coupling layer such that the magnitude of the interlayer coupling falls in the range equal to or larger than −3000 (Oe) and equal to or smaller than 100 (Oe). Examples of the average thickness of the nonmagnetic coupling layer 5 preferably falls in a range of 0.1 nm to 10 nm.

A nonmagnetic dielectric layer of $Al_2O_3$, $SiO_2$ or their equivalents was formed as the nonmagnetic spacer layer 11 on the magnetization free film 9. The layers can be formed by a sputtering method, a CVD (Chemical Vapor Deposition) method or other well-known method.

The third ferromagnetic material layer 13 was formed by a sputtering method using a ferromagnetic material including any of Co, Fe and Ni as a target.

TABLE 1

| Material of 1st and 2nd ferromagnetic material layers 3, 7 [nm] | Co | | | CoFe | | | Fe | | NiFe |
|---|---|---|---|---|---|---|---|---|---|
| Average thickness of 1st and 2nd ferromagnetic material layers 3, 7 [nm] | 1.0 | 1.2 | 1.8 | 1.0 | 0.75 | 2.0 | 0.96 | 1.5 | 2.0 |
| Material of nonmagnetic coupling layer | Cu | Au | Ru | Cu | Ag | Cr | Au | Au | Ag |
| Average thickness of nonmagnetic coupling layer for antiferromagnetic coupling [nm] | 0.5~1.0 1.5~2.3 2.7~3.6 | ~1.0 1.6~1.8 2.6~3.2 | ~1.0 1.4~2.1 2.7~3.3 | ~1.2 1.8~2.5 3.0~ | 1.2~2.4 2.6~3.6 | ~1.5 2.1~3.2 3.9~ | 1.4~2.6 3.2~4.2 | 1.2~2.0 3.7~5.0 | 0.6~1.9 2.1~2.6 |
| Average thickness of nonmagnetic coupling layer for ferromagnetic coupling [nm] | 1.0~1.5 2.3~2.7 3.6~ | 1.0~1.6 1.8~2.6 3.2~ | 1.0~1.4 2.1~2.7 | 1.2~1.8 2.5~3.0 3.3~ | 2.4~2.6 3.6~ | ~1.5 3.2~3.9 4.2~4.6 | 2.6~3.2 | 2.0~2.7 | 1.9~2.1 |

When the average thickness of the nonmagnetic coupling layer 5 of Table 1 is extremely thin as, for example, 0.5 nm, it is difficult to measure the average thickness and the corresponding column is made vacant. When the average thickness of the nonmagnetic coupling layer 5 is equal to or larger than 5 nm, the coupling between the first and the These laminated layers were finely patterned using photolithography or electron beam lithography. Its width was about 0.5 micrometer and an aspect ratio was about 1:4.

Figure 7A:
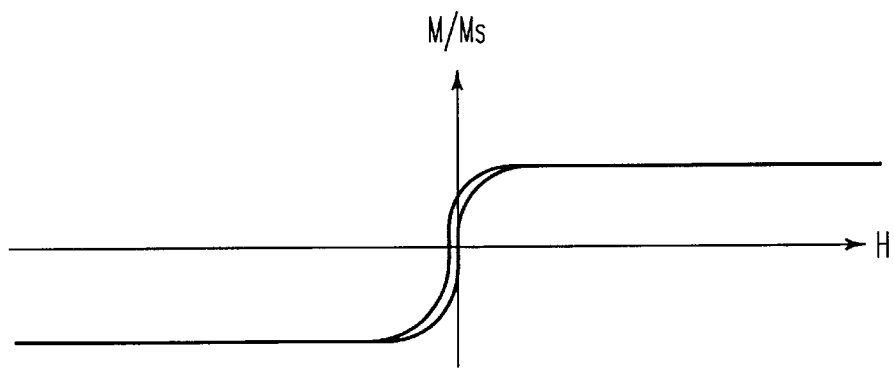
FIGS. 7A and 7B are graphs of magnetization curve of a magnetoresistance effect device according to a fifth example of the first embodiment of the present invention.

A magnetization curve of the magnetoresistance effect device of this embodiment was measured and the curve of FIG. 7A shows that the first and the second ferromagnetic material layers 3 and 7 are weakly coupled by an antiferromagnetic coupling. The coercive force of the layers was 5 (Oe) and the switching magnetic field was 35 (Oe). Although the two ferromagnetic material layers 3 and 7 had a magnetic coupling similar to antiferromagnetic coupling at their ends, the magnetic characteristic of the entire magnetization free film 9 was ferromagnetic and its squareness was near 1. This is because the magnetic structures of the first and the second ferromagnetic material layers 3 and 7 are controlled to have magnetic structures of FIGS. 4A and 4B.

Figure 7B:
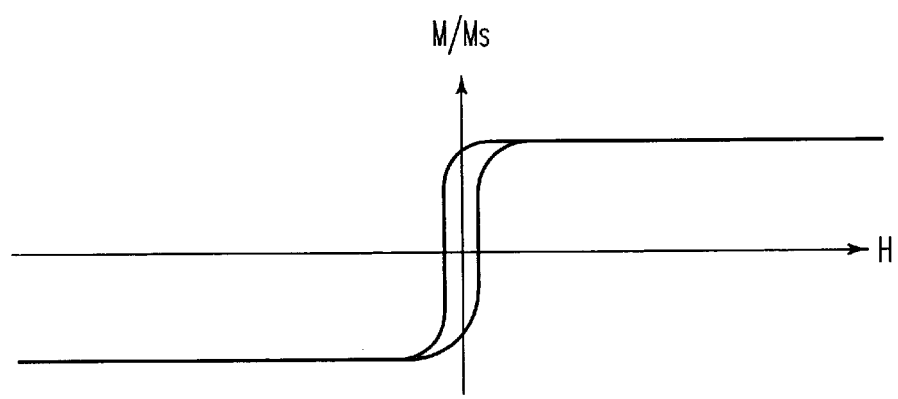

Another magnetization free film 9 where the two ferromagnetic material layers of average thickness of about 1.5 nm were formed and those ferromagnetic material layers are weakly ferromagnetically coupled with the coercive force of 26.5 (Oe) and the switching magnetic field of 36.5 (Oe) of FIG. 7B. The interlayer coupling of two ferromagnetic material layers was ferromagnetic.

Ferromagnetic coupling was created between the two ferromagnetic material layers 3 and 7, and the switching magnetic field stayed to be small enough. This is because the magnetic structures of the first and the second ferromagnetic material layers 3 and 7 are controlled to form magnetic structures shown in FIGS. 6A and 6B.

As a comparative example, a magnetization curve of magnetization free film that had strongly coupled two ferromagnetic material layers was measured. The ferromagnetic material layers consisted essentially of $Co_9Fe_1$ and were antiferromagnetically coupled. The rectangular magnetization free film had a width of 1 μm and an aspect ratio of 1:4. The coercive force of the magnetization free film of the comparative example was much larger than the examples of the present invention, and the saturated magnetic field of the film was equal to or larger than 3000 (Oe), whereby the square ratio was much smaller.

EXAMPLE 6

Figure 8:
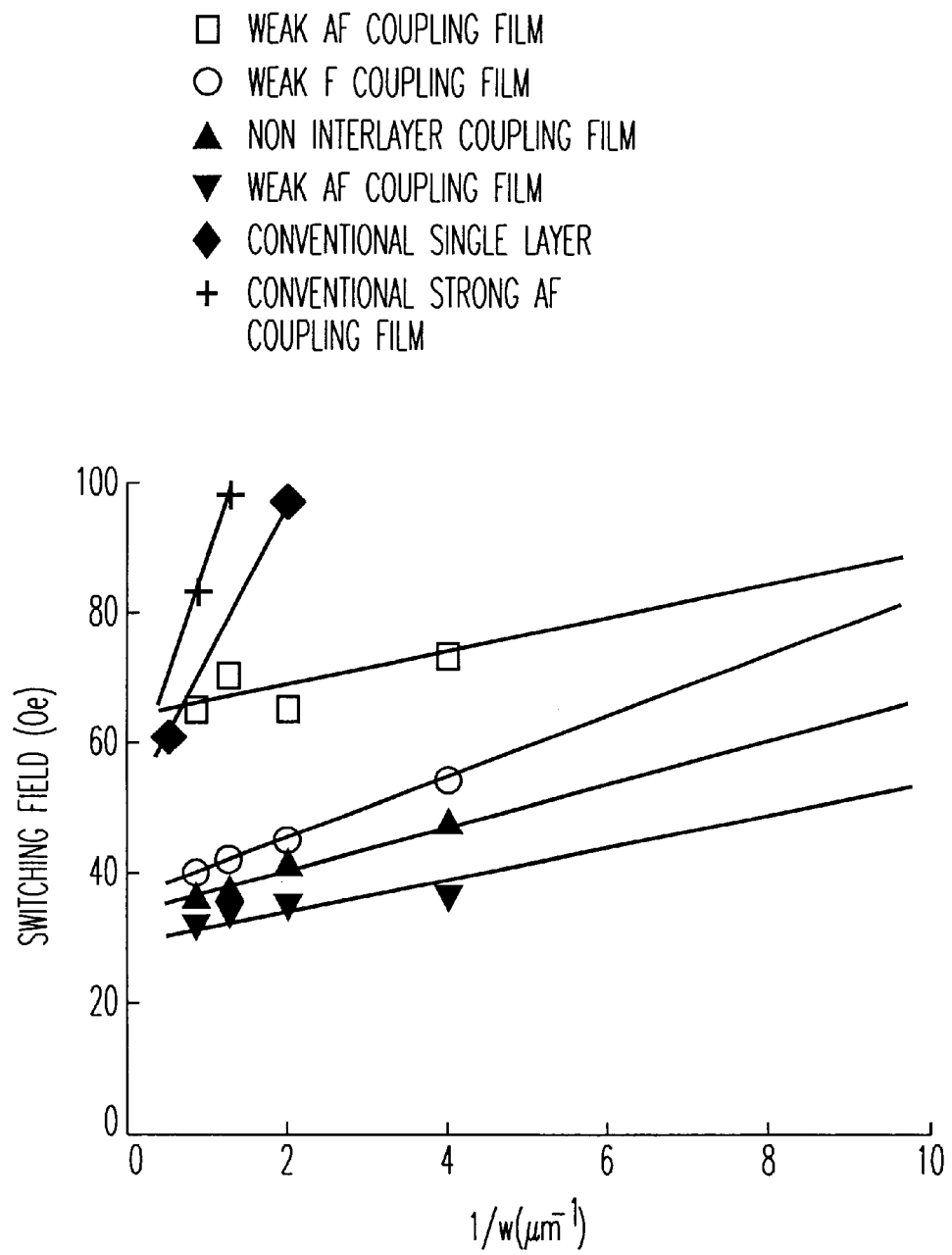
FIG. 8 is a graph of a magnetic characteristic of a magnetoresistance effect device according to a sixth example of the first embodiment of the present invention.

Switching magnetic fields of several magnetoresistance effect devices were scaled in a graph of FIG. 8. W of FIG. 8 corresponds to a width of the ferromagnetic material layer(s) or film and the respective widths ware 0.2 micrometer, 0.5 micrometer, 0.8 micrometer and 1.2 micrometers.

A magnetization free film, shown by ▼ WEAK AF COUPLING FILM, in which the first and the second ferromagnetic material layers 3 and 7 had same thickness, had a weak antiferromagnetic coupling (about −3000 (Oe)) between the ferromagnetic material layers 3 and 7. A magnetization free film, shown by ▲ NON-INTERLAYER COUPLING FILM, had no interlayer coupling but magnetostatic coupling between the ferromagnetic material layers 3 and 7. A magnetization free layer, shown by ○ WEAK F COUPLING FILM, had weak ferromagnetic coupling of about 100 (Oe) between the ferromagnetic material layers 3 and 7. A magnetization free layer, shown by □ WEAK AF COUPLING FILM, had a difference in thickness between the first and the second ferromagnetic material layers 3 and 7, where the first and the second ferromagnetic material layers are weakly coupled by antiferromagnetic coupling. A conventional magnetization free layer, shown by ◆ CONVENTIONAL SINGLE LAYER, comprised a single layer of the ferromagnetic material layer of $Co_9Fe_1$ having a thickness of 3.0 nm. A conventional magnetization free film, shown by + CONVENTIONAL STRONG AF COUPLING FILM, is tri-layer film which had a strong antiferromagnetic coupling between the first and the second ferromagnetic material layers 3 and 7 with a non-magnetic coupling layer interposed between the two ferromagnetic material layers.

The switching magnetic field for the magnetization free film of weak antiferromagnetic coupling having ferromagnetic material layers of the same thickness was smallest among the devices at any width. A small switching field of 51 (Oe) can be estimated when the result of the weak AF coupling film having ferromagnetic material layers of same thickness is extrapolated to a width of 0.1 micrometer.

A magnitude of a magnetic field produced by a bit line or a word line disposed near the magnetoresistance effect device and necessary to invert the magnetization of the magnetization free film 9 of the device was measured using computer simulation. The bit line and the word line had a cross-section of a rectangular shape, and width of 0.1 micrometer with an aspect ratio of 1:2. Material of the bit lines was one of Cu and W. A shield layer of high permeability, such as NiFe alloy or its equivalents, was used in the simulation. The shield layer was disposed adjacent to the lines and had an opening surfaced to the magnetoresistance effect device in its cross-sectional view.

When current of $5 \times 10^6$ A/cm$^2$ was made to flow to the line, a magnitude of a magnetic field at a position remote from the electrode by about 50 nm was about 76 (Oe). In reference to the extrapolated value of FIG. 8, when the width of the ferromagnetic material layers is 0.1 micrometer, magnetization inversion of the weak antiferromagnetic coupling film and the film that does not have interlayer coupling but has magnetostatic coupling can be performed.

When there is no interlayer coupling between the first and the second ferromagnetic material layers (i.e., J=0) and an interactive action by magnetostatic coupling caused by stray magnetic field from the ferromagnetic material layers is present, the switching magnetic field can be reduced (Digest of 24th Conference of Magnetics Society of Japan p. 26, 27 of 24th Conference of magnetics Society of Japan 12aB-3, 12aB-7).

Without interlayer coupling between ferromagnetic material layers, the magnetic structures of the ferromagnetic material layers are unstable and the squareness in a hysteresis curve or a magnetoresistance curve decreases, whereby it becomes difficult to provide a large magnetoresistance amplitude.

In a second embodiment of the present invention, an explanation will be focused on a surface roughness of an intersurface between the first ferromagnetic material layer 3 or the second ferromagnetic material layer 7 and the nonmagnetic coupling layer 5.

In the second embodiment, layers equivalent to those of the first embodiment are referenced with the same symbols and detailed explanation of the layers, such as their material or thickness, will be omitted.

An electrode layer made of Cu or its equivalent was formed on an Si (100) substrate by using a sputtering apparatus and a surface of the electrode layer was planarized by annealing. The electrode may be used as a buffer layer. A ferromagnetic material layer of Co, Fe, NiFe, CoFe or their equivalent, a nonmagnetic metal of Cu, Au, Ru or their equivalent and a ferromagnetic material layer of Co, Fe, NiFe, CoFe or their equivalent were successively laminated on the buffer layer. An inert gas of Ar or its equivalent was introduced into a vacuum chamber to maintain pressure of from about $10^{-7}$ through about $10^{-8}$ Torr. When using magnetron-sputtering apparatus, pressure of the introducing gas can be set at, for example, from about $10^{-3}$ through about $10^{-2}$ Torr.

Several methods can be employed to make a surface roughness of either of interfaces between the first and the second ferromagnetic material layers 3 and 7 and the nonmagnetic coupling layer 5 equal to or larger than 0.2 nm. For example, the buffer layer can be modified to have an average thickness equal to or larger than about 5 nm, the material of the buffer layer can be changed to, for example, either one of Ta, Al, Co and their equivalent, the pressure of Ar gas can be increased when the buffer layer is not used, and/or bias voltage can be applied to the substrate during the sputtering of the layers.

The surface roughness of the interfaces can be measured by an X-ray Reflectivity method. Or, the surface roughness can be evaluated by directly observing a sectional image taken with a TEM. Further, the surface roughness can be measured by using an Auger electron spectroscopy, or secondary ion mass spectrometry.

According to the X-ray Reflectivity method, the film thickness or the surface roughness can be measured without destroying the device by analyzing reflection profile obtained upon applying an angle X-lay of low incident angle. A Cu target is used for an X-ray source and Cu—K radiation is extracted by using a Ge (111) crystal spectroscope. The X-ray is set to be incident on device surface so that the X-ray would be entirely reflected by the surface. A scintillation counter of NaI can be used as a detector.

Figure 9:
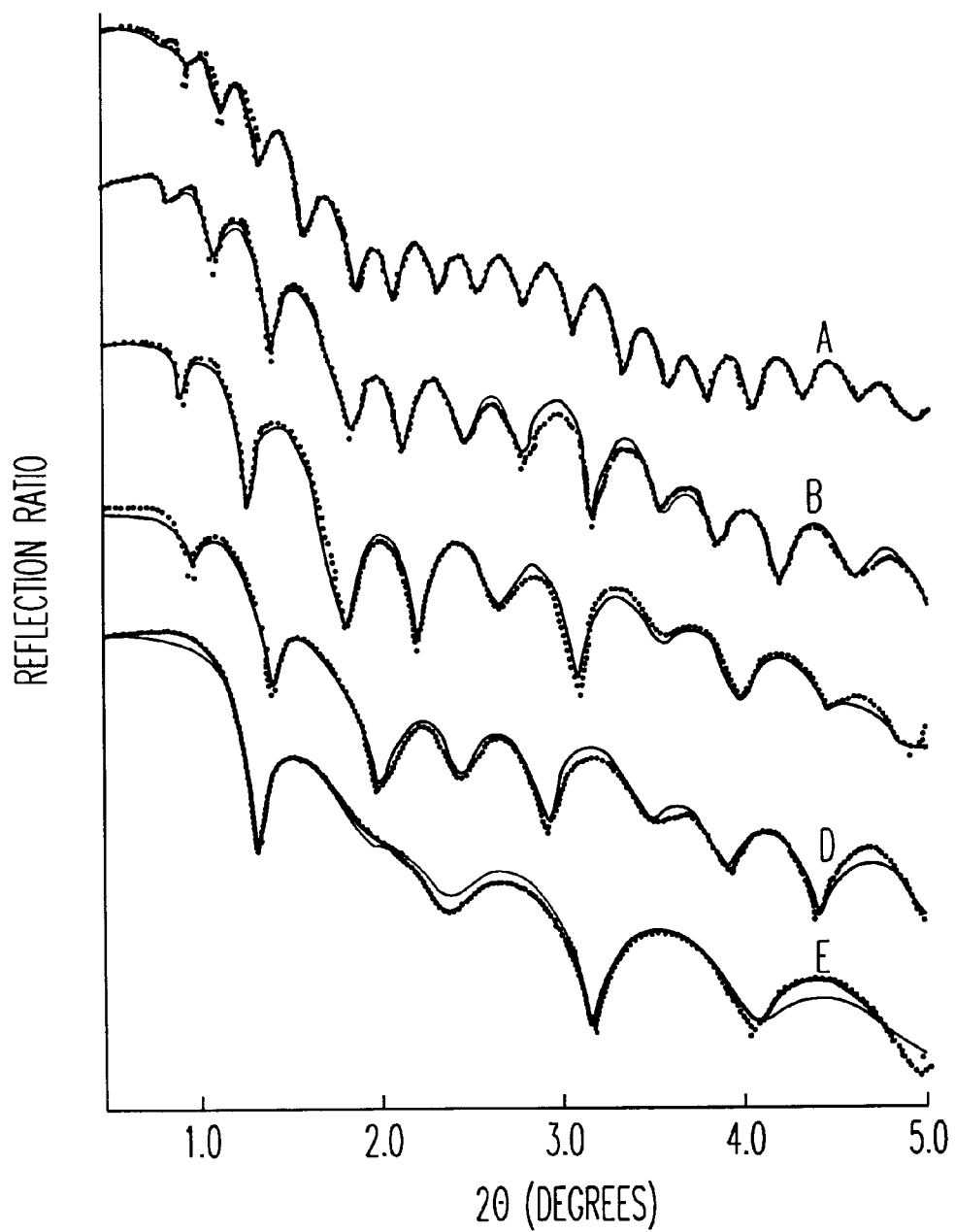
FIG. 9 is a graph of an X-ray reflection ratio of a magnetoresistance effect device according to a second embodiment of the present invention.

X-ray Reflectivity of FIG. 9 was measured on several samples by applying the X-ray of low incident angle to device surface. A method of least square can be used to obtain respective film thickness and surface roughness of the intersurface with respect to the data.

Figure 10:
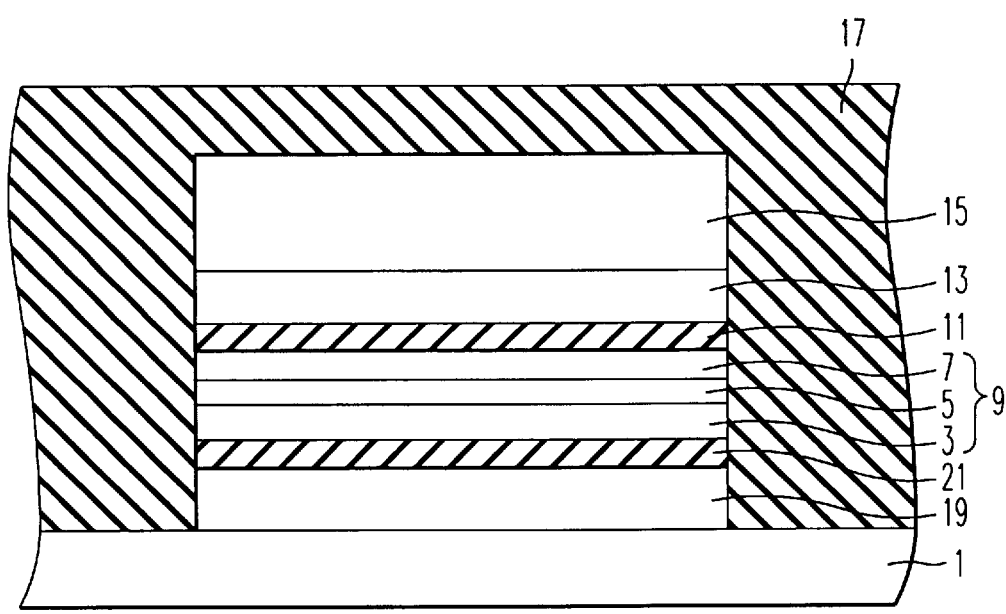
FIG. 10 is a cross-sectional view of a magnetoresistance effect device according to a third embodiment of the present invention.

FIG. 10 is a cross-sectional view of a magnetoresistance effect device using double tunnel junctions according to a third embodiment of the present invention.

The magnetoresistance effect device of FIG. 10 includes a fourth ferromagnetic material layer 19 above the first electrode 1 and a second nonmagnetic dielectric layer 21 formed on the fourth ferromagnetic material layer 19. The fourth ferromagnetic material layer 19 has a substantially fixed magnetization the same as that of the third ferromagnetic material layer 13. The double tunnel junction device has two ferromagnetic tunnel junctions. One of the tunnel junctions is formed between the fourth ferromagnetic material layer 19 and the first ferromagnetic material layer 3 with the second dielectric material layer 21 disposed between them. Another tunnel junction is formed between the second ferromagnetic material layer 7 and the third ferromagnetic material layer 13 with the first dielectric material layer 11 disposed between them.

Material composition and film thickness of the fourth ferromagnetic material layer 19 can pertinently be determined in reference to the third ferromagnetic material layer 13. Material composition and film thickness of the second nonmagnetic dielectric layer 21 can pertinently be determined in reference to the first nonmagnetic dielectric layer 11.

The magnetoresistance effect device of the third embodiment has the magnetization free film 9, whereby an excellent magnetic double tunnel junction device having a low switching magnetic field can be obtained.

Figure 11:
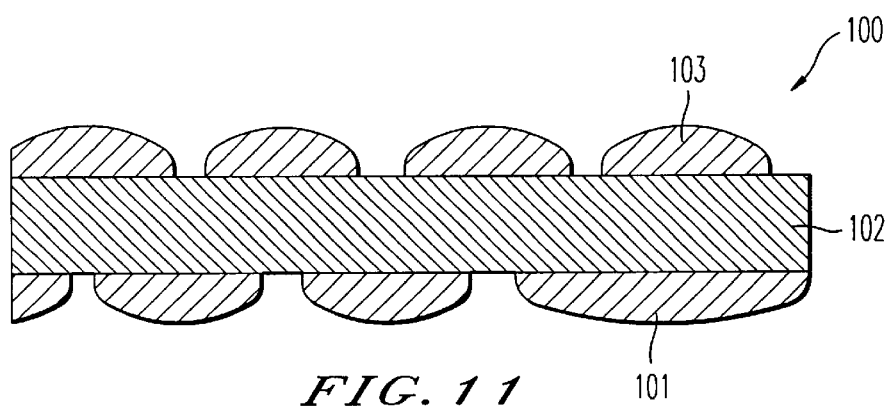
FIG. 11 is a cross-sectional view of a memory layer of a magnetoresistance effect device according to a fourth embodiment of the present invention.

FIG. 11 is a cross-sectional view of a magnetization free film of a TMR device according to a fourth embodiment of the present invention.

The magnetic film 100 of the TMR device of FIG. 11 comprises magnetic material particles 101 and 103 in a shape of small particles (including island-like growth) with a nonmagnetic layer 102 disposed between the two kinds particles 101 and 103. The magnetic material particles 101 and 103 formed on the upper and lower surfaces of the nonmagnetic layer 102 and comprising very small particles are ferromagnetically coupled with each other. Such a magnetic film 100 shows ferromagnetic properties as a whole.

When magnetization is inverted by applying a magnetic field in a direction opposed to ferromagnetism of the magnetic film 100, a change in the magnetic properties of the magnetic film 100 occurs. A small particle of ferromagnetic material has a magnetization which is easy to rotate/invert. However, since a direction of magnetization is dispersed in a weak magnetic field owing to an influence of thermal fluctuation, an aggregation of small particles shows superparamagnetic properties in which magnetization is not saturated unless a strong magnetic field is applied.

When the weak ferromagnetic coupling is provided among the small particles, magnetization of the respective small particles is inverted while the particles are receiving ferromagnetic coupling force in the same direction of magnetization and being subjected to magnetization inversion, whereby magnetization is inverted by a small inverting magnetic field as a whole.

The smaller the size of the particles, and/or the weaker the coupling force among the small particles, the smaller becomes the inversion magnetic field. When the magnetic coupling is weakened by addition of antiferromagnetic particles, a similar effect of reducing the inversion magnetic field can be obtained.

According to such a magnetic film, the respective magnetic small particles are separated from each other and therefore, there can be provided a memory cell substantially free of influence of shape or size of the cell and which has small dispersion in the switching magnetic field.

Figure 12:
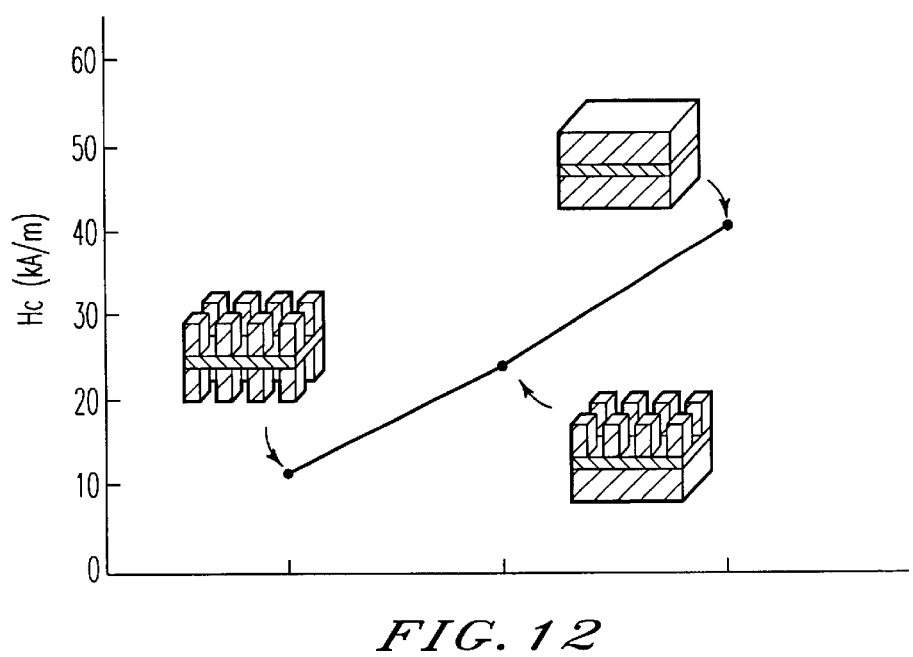
FIG. 12 is a graph of a magnetic characteristic of a tri-layered magnetic film of the magnetoresistance effect device according to the fourth embodiment of the present invention.

FIG. 12 is a graph of a calculated magnetic characteristic of a tri-layered magnetic film, as a magnetization free film, of the magnetoresistance effect device according to the fourth embodiment of the present invention. The magnetic characteristic is a coercive force Hc (kA/m) of memory cells of respective tri-layered magnetic laminated film. The tri-layered magnetic laminated film comprises ferromagnetic material layers coupled ferromagnetically through a nonmagnetic layer disposed between the coupled ferromagnetic material layers. The tri-layered film in which continuous and uniform ferromagnetic material layers are formed on upper and lower surfaces of the nonmagnetic material layer has the highest coercive force. The tri-layered film in which one continuous and uniform ferromagnetic material layer is formed on the nonmagnetic material layer and small ferromagnetic material particles are formed on the nonmagnetic material opposite to the continuous ferromagnetic material layer has medium coercive force. The tri-layered film in which ferromagnetic material particles are formed on both side of the nonmagnetic material layer has the smallest coercive force.

The above-described characteristic was produced based on the assumption that a width of the tri-layered film was 100 nm, a length of the tri-layered film was 400 nm and a film thickness of ferromagnetic material layer or the ferromagnetic material particles was 1 nm. It was also assumed that a bottom surface of the small particle had a square bottom having one-side length of 40 nm, and each small particle had a regular parallelepiped shape having a height of 1 nm with an interval between adjacent particles of 20 nm.

The result of FIG. 12 shows that small ferromagnetic material particles formed on both surfaces of the nonmagnetic material layer 102 can reduce the coercive force Hc by ¼.

Other experiments also showed that a substantially similar effect is achieved even when the small particles are partially brought into contact with each other, or a continuous film whose film thickness is not uniform and a magnetic coupling at its thin portion thereof is weak.

The continuous magnetic layer having a non-uniform thickness, in which a film thickness of a thinnest portion is equal to or smaller than 1 nm and a film thickness of a thickest portion is larger than the film thickness of the thinnest portion by 20% or more, can have a substantially similar effect.

The ferromagnetic material particles having an average size of equal to or larger than 0.3 nm and equal to or smaller than 3 nm, or island-like growth ferromagnetic material having an average height of equal to or larger than 0.3 nm and equal to or smaller than 3 nm, have an effect of reduction of coercive force substantially similar to that calculated.

Each of the ferromagnetic material particles 101 and 103 has a superparamagnetic component in its magnetization hysteresis curve. The superparamagnetic component means the layer has a residual magnetization near to zero and the layer's magnetization does not saturate unless a strong magnetic field is applied. Each of the ferromagnetic material particles 101 and 103 itself has a larger rate Mr/Ms of residual magnetization Mr to the saturated magnetization Ms than zero, but smaller than 1, poor squareness of the hysteresis and large switching magnetic field. Even though the ferromagnetic material particles show superparamagnetic properties, the magnetic film can have a Mr/Ms of 1, whereby the switching magnetic field of the magnetic film decreases.

Magnetic materials for the ferromagnetic material particles and particles are same as the above-described materials for the ferromagnetic material layers 3 and 7. Nonmagnetic material for the nonmagnetic material layer 102 can be selected from a group consisting of Ru, Ir, Cu, Au, Ag and their equivalents.

Figure 13A:
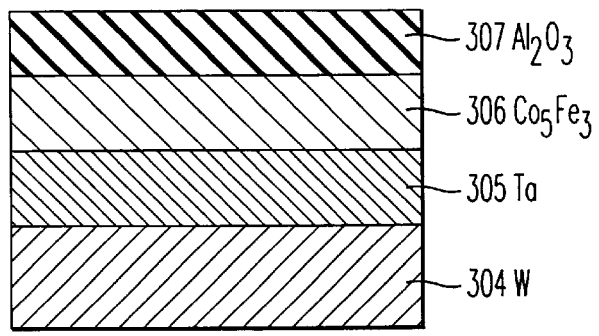
FIGS. 13A, 13B, 13C, 14A, and 14B are cross-sectional view s for an explanation of a method of manufacturing a double tunnel junction magnetoresistance effect device according to a fifth embodiment of the present invention.

FIGS. 13A, 13B, 13C, 14A and 14B are cross-sectional views for describing a method of fabricating a double junction TMR device according to a fifth embodiment of the present invention. A lower electrode 304 of W, a buffer layer 305 of Ta, a lower magnetization pinned layer 306 of $Co_5Fe_5$ and a dielectric layer 307 of $Al_2O_3$ as a lower tunnel barrier layer of FIG. 13A, are successively deposited above a semiconductor substrate (not illustrated) using a high vacuum sputtering method.

An appropriate surface roughness can be produced to the multi-layered film of FIG. 13A, since the layers from the lowermost layer 304 of W of W to the uppermost layer 307 of $Al_2O_3$ are successively deposited on previous metal layers.

Figure 13B:
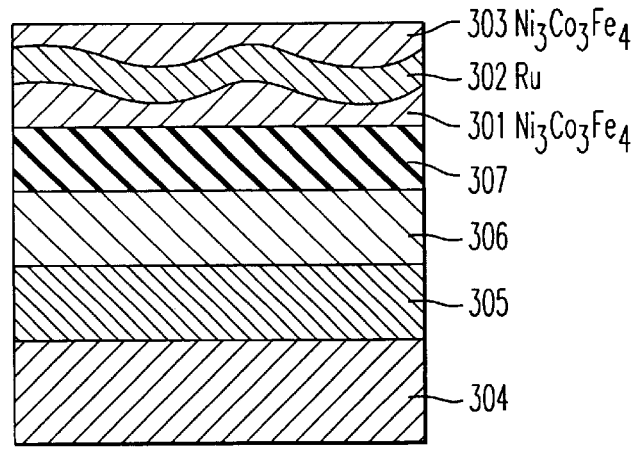

As a magnetization free film, a tri-layered magnetic laminated film of FIG. 13B is formed on the dielectric layer 307 of $Al_2O_3$. A $Ni_3Co_3Fe_4$ layer 301 having a thickness of 1.2 nm (it is calculated from film forming speed and film forming time), a nonmagnetic layer of Ru layer 302 having a thickness of 1.4 nm (it is calculated from film forming time and speed), and a $Ni_3Co_3Fe_4$ layer 303 having a thickness of 1.2 nm (it is calculated from film forming time and speed) are formed successively.

The $Ni_3Co_3Fe_4$ layer 301 is deposited on the dielectric layer 307 of $Al_2O_3$. When a metal layer is deposited on a dielectric layer, a coupling force of each metal atom in respect to the dielectric layer is weak and therefore, the metal layer grows initially as islands and, with progress of deposition, the islands are melted together, thereby to increase the film thickness.

The film thickness of $Ni_3Co_3Fe_4$ layer 301 of FIG. 13B on the dielectric layer 307 of $Al_2O_3$ becomes non-uniform. Uniformity (non-uniformity) of $Ni_3Co_3Fe_4$ layer 301 can be controlled by varying substrate temperature or gas pressure of a sputtering apparatus such that a film thickness at the thinnest portion of $Ni_3Co_3Fe_4$ layer 301 is equal to or smaller than 1 nm and a film thickness of the thickest portion is larger than the film thickness of the thinnest portion by 20% or more.

The nonmagnetic layer 302 of Ru and $Ni_3Co_3Fe_4$ layer 303 are successively deposited on the $Ni_3Co_3Fe_4$ layer 301 and therefore, the flatness of film surface recovers. When a surface of $Ni_3Co_3Fe_4$ layer 303 does not show flatness which is appropriate for a successive step, a known planarization step may be employed.

Figure 13C:
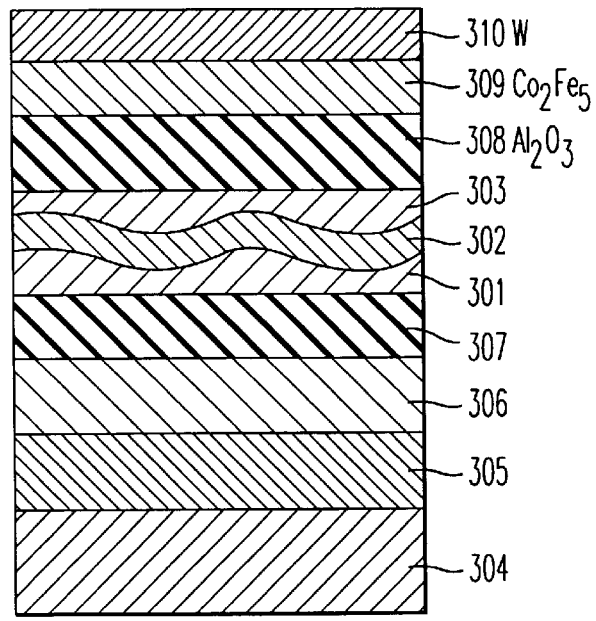

A dielectric layer 308 of $Al_2O_3$ which forms an upper tunnel barrier layer, an upper magnetization pinned layer 309 of $Co_5Fe_5$ and an upper protection layer 310 of W of FIG. 13C are successively formed on the $Ni_3Co_3Fe_4$ layer 303.

Figure 14A:
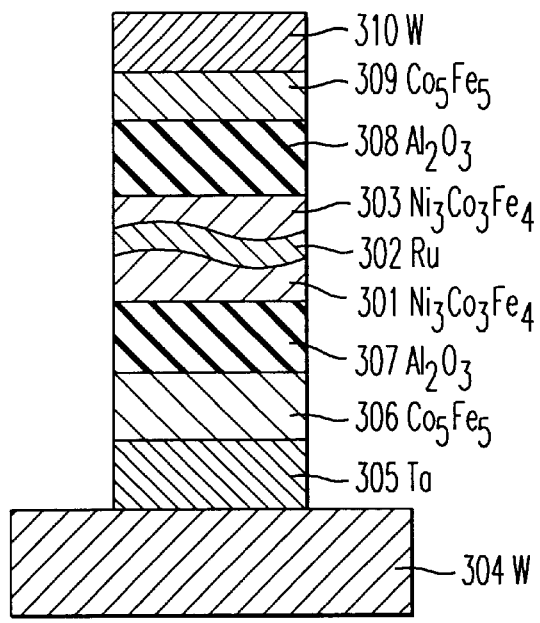

A mask pattern of a photoresist (not illustrated) for prescribing a shape of the TMR device of FIG. 14A is formed on the laminated film and ion milling is applied by using the photoresist as a mask and the lower electrode 304 of W of FIG. 14A is also patterned through ion milling using another photoresist pattern. The TMR device has a rectangular shape of 200 nm×600 nm.

Figure 14B:
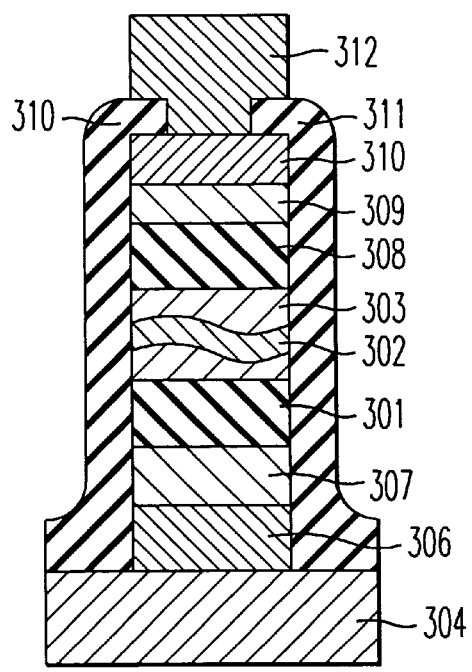

An interlayer insulating film 311 of $SiO_2$ of FIG. 14B is formed on the device by using a reactive sputtering method and a contact hole is formed on top of the device. An upper electrode 312 is filled in the contact hole and coupled with the upper protection layer 310 of W.

Figure 15A:
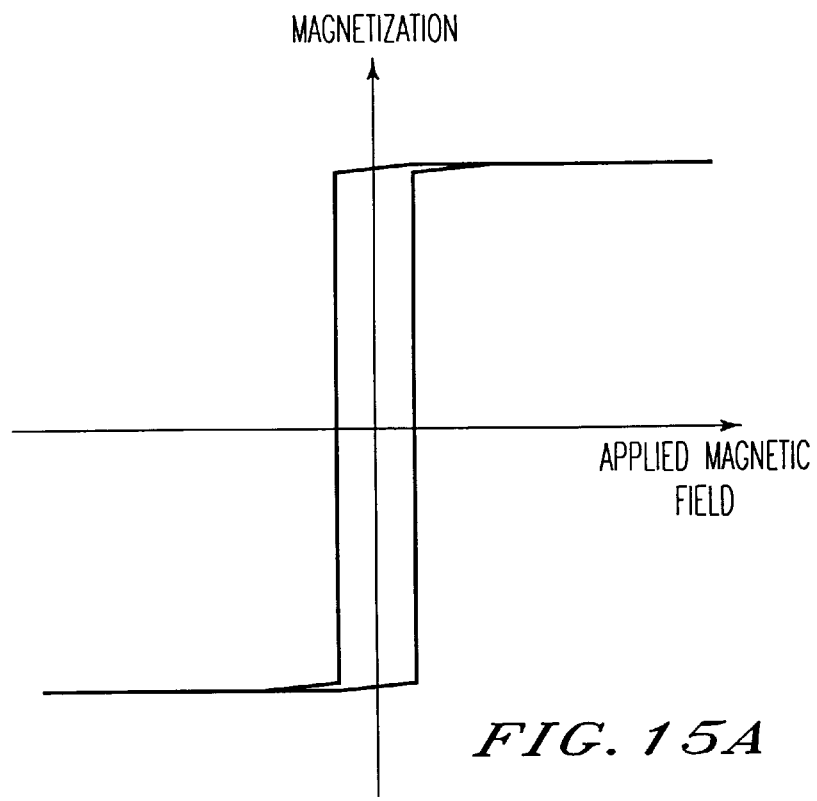
FIGS. 15A and 15B are graphs of a magnetic characteristic of the double tunnel junction magnetoresistance effect device according to the fifth embodiment of the present invention in comparison with a conventional device.

A TMR device manufactured by the above-described method had MR amplitude of 40 percent at bias voltage of 0.1 V. A switching magnetic field for the device was 2.4 kA/m and its square ratio of the magnetization hysteresis of FIG. 15A was very good.

Figure 15B:
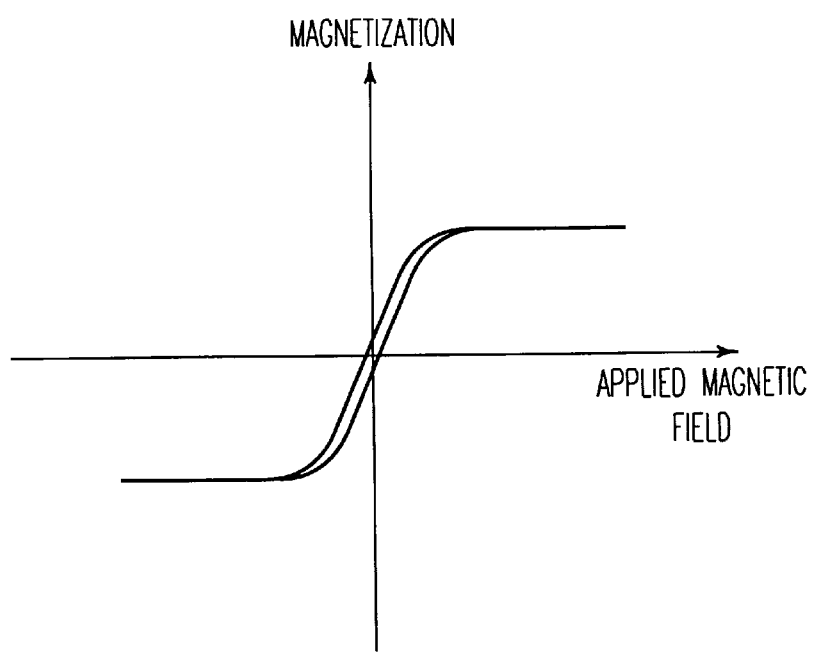

A TMR device fabricated by a similar manufacturing method, except that the magnetization free film was replaced with a single layer of $Ni_3Co_3Fe_4$ having a thickness of 1.2 nm, had a magnetic characteristic of FIG. 15B. The device having the single layer of $Ni_3Co_3Fe_4$ as a magnetization free layer had superparamagnetic property in which a squareness of a magnetization hysteresis property is deteriorated, residual magnetization is near to zero, and magnetization is not saturated unless a strong magnetic field is applied thereto.

Another memory cell of 200 nm×600 nm in which two $Ni_3Co_3Fe_4$ layers were made to have uniform thickness by controlling the substrate temperature and the gas pressure of the sputtering apparatus had the switching magnetic field of as large as 9.6 kA/m.

According to the TMR device of the fourth embodiment of the present invention, the squareness of the magnetization hysteresis property is excellent and, at the same time, a considerable reduction in the switching magnetic field can be realized.

The TMR devices of the above-described embodiments are preferably used as, for example, a magnetic sensor, and the device for the magnetic sensor may be formed not only on a semiconductor substrate but also on a glass substrate.

FIG. 16A, FIG. 16B, FIG. 16C, FIG. 17A and FIG. 17B are cross-sectional views for describing a manufacturing method of double junction TMR device according to a sixth embodiment of the present invention.

In this embodiment, each of the ferromagnetic material layers of magnetization pinned layers are formed in contact with an antiferromagnetic material layer, whereby those magnetization pinned layers are used as reference layers. As used in highly integrated MRAM, the TMR device using the antiferromagnetic material layers is useful because of its small occurrence rate of erroneous operation by stray magnetic field.

As memory cells for MRAM, TMR devices are usually formed on a surface of the semiconductor substrate with a necessary insulator layer formed between them. The lower electrode is connected to a selecting transistor at a main surface of the semiconductor substrate via a plug penetrating the insulating film.

Figure 16A:
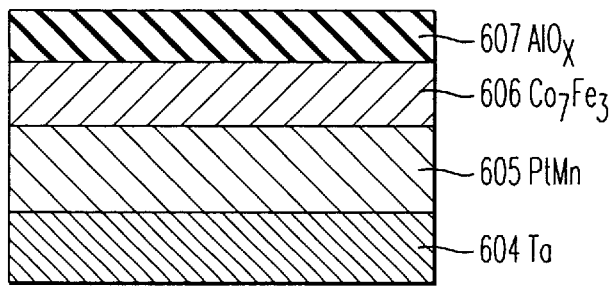
FIGS. 16A, 16B, 16C, 17A, and 17B are cross-sectional views for an explanation of a manufacturing method of a double tunnel junction magnetoresistance effect device according to a sixth embodiment of the present invention.

A lower electrode as a buffer layer 604 of Ta, a lower antiferromagnetic material layer 605 of PtMn and a lower reference layer 606 of $Co_7Fe_3$ of FIG. 16A, are successively deposited by using a high vacuum sputtering method on an interlayer insulating film and a plug (not illustrated) formed on a semiconductor substrate.

An Al layer having a thickness of 0.8 nm was formed and the Al layer is oxidized in an ozone atmosphere, thereby form a dielectric layer 607 of $AlO_x$ ($1 \leq x \leq 1.5$) of FIG. 16A as a lower tunnel barrier layer.

Figure 16B:
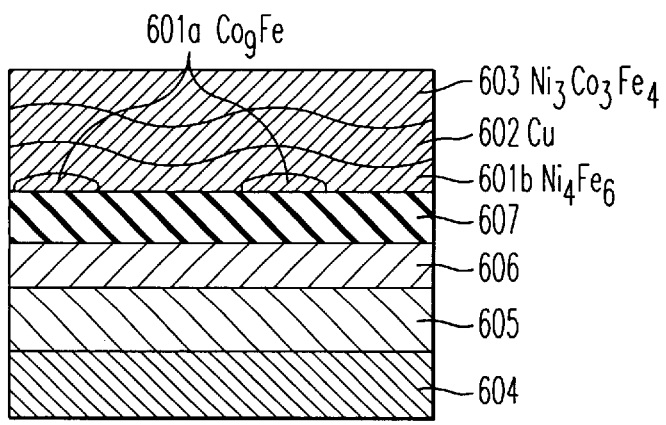
Figure 16C:
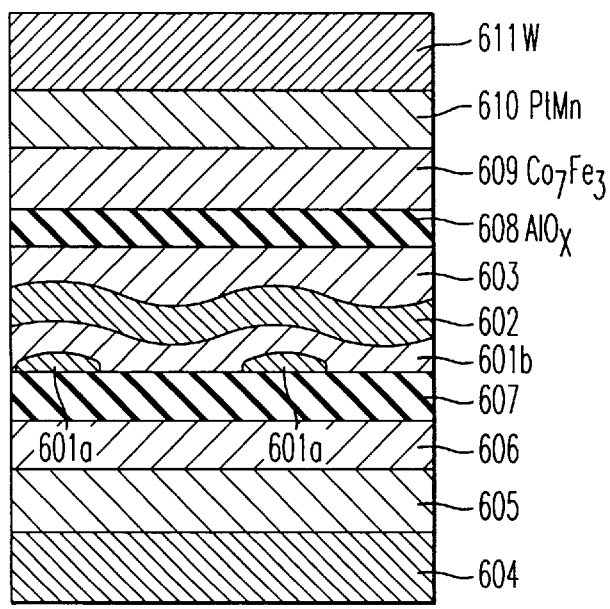

A tri-layered magnetic laminated film which may be said as a magnetic thin film is formed on layer 607 of $AlO_x$. Small particles 601 (or island-like growth layer) of $Co_9Fe_1$ having a thickness of 0.5 nm (it is calculated from film forming speed and time), a $Ni_4Fe_6$ layer 601b having a thickness of 1.0 nm (it is calculated from film forming speed and time), a nonmagnetic layer of Cu 602 having a thickness of 1.5 nm (it is calculated from film forming speed and time) and a $Ni_3Co_3Fe_4$ layer 603 having a thickness of 1.2 nm (it is calculated from film forming speed and time) of FIG. 16B are successively formed on the dielectric layer 607 of $AlO_x$.

The $Ni_4Fe_6$ layer 601b is deposited as a continuous film having a non-uniform thickness to embed clearances between the small particles 601a of $Co_9Fe$ (or island-like growth layer). The particles 601a of $Co_9Fe_1$ and $Ni_4Fe_6$ layer 601b are a ferromagnetic material layer having a non-uniform thickness as a whole. The particles of $Co_9Fe_1$ may alternatively be formed in a layer of non-uniform thickness.

An upper tunnel barrier layer is formed on the $Ni_3Co_3Fe_4$ layer 603. An Al layer having a thickness of 0.8 nm is formed on the $Ni_3Co_3Fe_4$ layer 603 and thereafter the Al layer is oxidized in an ozone atmosphere to form $AlO_x$ layer 608 ($1 \leq x \leq 1.5$) as the upper tunnel barrier layer. A $Co_7Fe_3$ layer 609, as an upper magnetization pinned layer, is formed on the $AlO_x$ layer 608. An upper antiferromagnetic material layer 610 of PtMn is formed on the $Co_7Fe_3$ layer 609 and provided with an antiferromagnetic coupling with the $Co_7Fe_3$ layer 609. As an alternative material for the antiferromagnetic material layer, RhMn, IrMn, PrRhMn, PtCrMn or equivalents can be used. An upper protection layer 611 of W is formed on the antiferromagnetic material layer 610 of PtMn.

Figure 17A:
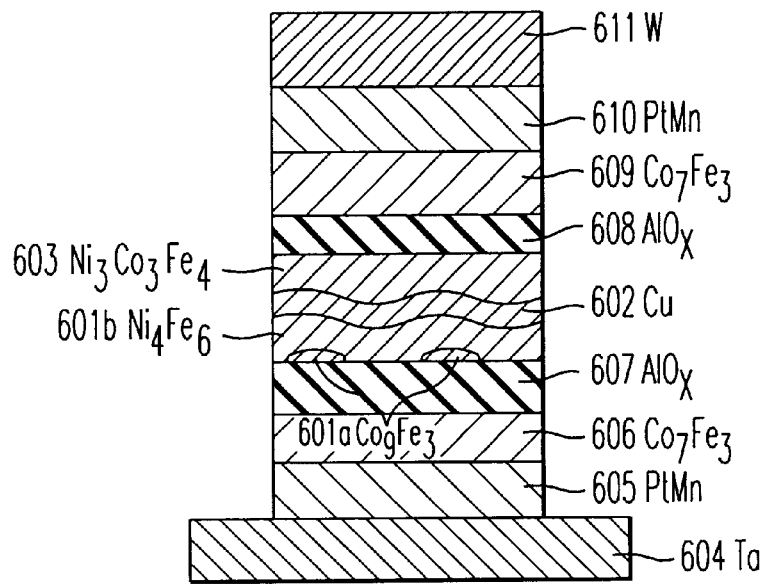

The TMR device of FIG. 17A is fabricated by forming a photoresist mask pattern (not illustrated) and carrying out ion milling using the mask pattern. The fabricated TMR device has a rectangular shape of 100 nm×300 nm. The Ta layer 604 of FIG. 17A is also fabricated by forming a photoresist mask pattern (not illustrated) and carrying out ion milling using the mask pattern, whereby patterns of lower electrode is formed.

Figure 17B:
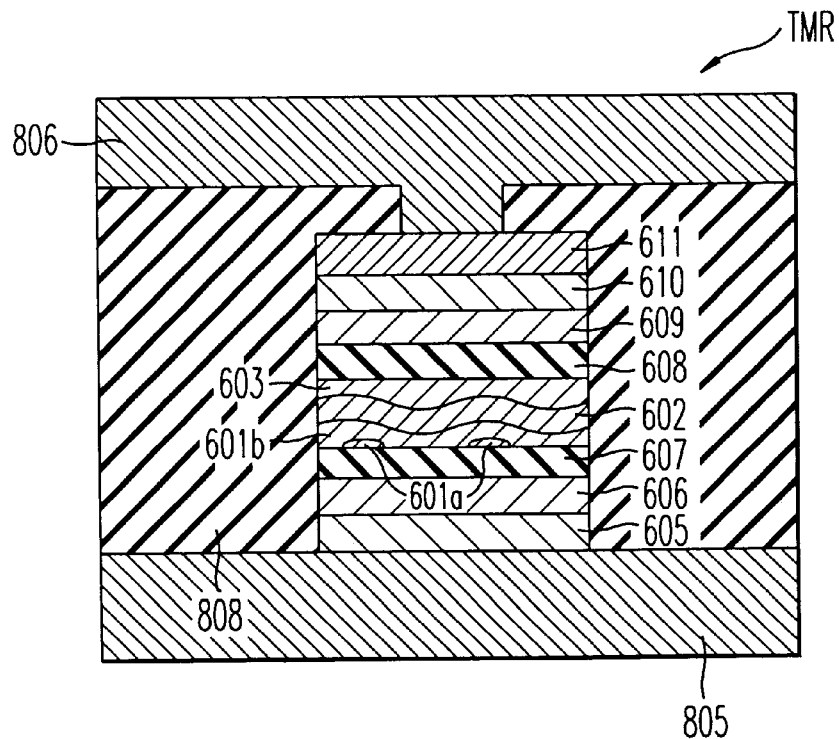

A $SiO_2$ layer 808 of FIG. 17B is formed on the device by using a reactive sputtering method. An annealing at 300° C. for 2 hours is applied under a magnetic field of 500 kA/m in vacuum. Magnetizations of the magnetization pinned layers 606 and 609 are pinned/fixed by antiferromagnetic exchange coupling with respective laminated antiferromagnetic materials 605 and 610 during annealing.

A contact hole is open to the upper protection layer of W 611 and an upper electrode (or bit line of MRAM) 806 is filled in the contact hole, thereby coupled with the protection layer 611 of W.

A TMR device manufactured by above-described method, had a MR amplitude of 25% at bias voltage of 0.5 V and also had a switching magnetic field of 3.2 $kAm^{-1}$, whereby a electrical current necessary for the magnetization rotation/inversion is reduced to 1 mA from 10 mA.

FIG. 18A, FIG. 18B, FIG. 18C, FIG. 18D, FIG. 18E, FIG. 18F and FIG. 18G are cross-sectional views and plan views of magnetic laminated films according to a seventh embodiment of the present invention.

The tri-layered laminated film as a magnetization free layer of a magnetization free film of FIG. 18A includes two uniform ferromagnetic material layers 701 and 703 sandwiching a nonmagnetic layer 702. The layer 701 may alternatively include a soft magnetic material whose direction of magnetization is easier to rotate than the ferromagnetic material. The direction of magnetization is in a direction along in plane of the magnetic laminated film as shown by arrows of FIG. 18B. By optimizing a thickness and a material of respective ferromagnetic material layers, the memory layer has a small switching magnetic field.

When the memory layer is the tri-layered laminated film having a substantially uniform film thickness through the whole film or a single layer of substantially uniform film thickness, edge domains 705 of FIG. 18B are formed at terminal end portions in contrast to a normal central magnetic domain 704.

Usually a length in a direction of an easy magnetization axis is prolonged relative to a width in order to reduce influence of a demagnetizing field, whereby the occurrence rate of the edge domain 705 increases and rotation of magnetization is hampered.

According to the memory layer of the above-described embodiments, when ferromagnetic material layers 701a and 703a of FIG. 18C, each having non-uniform film thickness are laminated via a nonmagnetic layer 702a, a single domain 706 of FIG. 18D can be obtained and the occurrence of the edge domains can be reduced.

As already described, the tri-layered magnetic layer provided with a continuous film having a non-uniform thickness can be used as a magnetization free layer in which a direction of magnetization changes/rotates under applied magnetic field.

The tri-layered magnetic layer can also be used as a magnetization pinned layer which maintains a direction of magnetization in zero magnetic field even if a magnetic field is applied, by an employment of appropriate manufacturing conditions.

The effect of non-uniform ferromagnetic material layer is not necessarily achieved only by the film thickness, but, for example by making a composition of the ferromagnetic material layer non-uniform, whereby the occurrence of edge domains can also be reduced. As already described, by making both or either of the ferromagnetic material layers 701a and 703a in the shape of a small particle or island-like growth, the edge domain can be avoided. Magnetic inner domains each formed in the particles or islands are collectively moved as magnetization domain as a whole, thereby forms a substantial single domain.

The ferromagnetic particles or ferromagnetic islands may be dispersed in a nonmagnetic layer or covered by a ferromagnetic material layer.

A ferromagnetic material layer 712 as the magnetization pinned layer of FIG. 18E is disposed on one side of a dielectric tunnel barrier layer 711. As a single layer, the magnetization pinned layer 712 usually comprises a hard magnetic material. However, a fixing magnetization may not be sufficient. Stray magnetic fields from the ferromagnetic material layer 712 of FIG. 18E may shift a switching magnetic field of a magnetization free layer 710.

As an alternative structure, an antiferromagnetic material layer 713 of FIG. 18F can be disposed on the ferromagnetic material layer 712 and fix the magnetization of the ferromagnetic material layer 712 by magnetic coupling. However, the influence of stray magnetic fields from the ferromagnetic material layer 712 of FIG. 18F may not be reduced. As a further alternative structure, a magnetic laminated film comprising ferromagnetic material layers 712 and 714 of FIG. 18G can be employed and disposed on one side of the tunnel barrier layer 711.

In the magnetic laminated film, the ferromagnetic material layers 712 and 714 are coupled with each other antiferromagnetically such that directions of magnetization are reversed via the nonmagnetic layer 715 and the magnetic laminated film is used as the layer having fixed magnetization of the TMR device for MRAM. The magnetization pinned layer shown in FIG. 18G is provided with extremely strong antiferromagnetic coupling by selecting a thickness t of the nonmagnetic layer 715. By selecting thickness of the ferromagnetic material layers 712 and 714 and of the nonmagnetic layer 715 of FIG. 18G, a closed magnetic circuit between the ferromagnetic material layers 712 and 714, therefore influence of stray magnetic field onto the magnetization free layer 710, can be reduced.

The tri-layered magnetic film can also be applied to a giant magneto-resistive effect device (GMR device), where, as described, a nonmagnetic conductive metal layer, for example a Cu layer, is applied in place of the tunnel barrier layers.

Although some embodiments are described with a focus on double junction TMR device, the embodiments are not necessarily limited to the double junction TMR device and but also applicable to a single junction TMR device of FIG. 1, in which a single tunnel barrier is employed in one magnetoresistance effect device.

As far as the small particles of the ferromagnetic material 101, 103 or non-uniform ferromagnetic material layers 301, 303, 601b, 603, 701a, 703a disposed on a nonmagnetic material layer 102, 302, 602, 702a are coupled to each other with a weak ferromagnetic coupling, the nonmagnetic material layer can be omitted. In this case, the magnetization free layer may have small ferromagnetic material particles or island-like growth regions brought into contact with each other in the same plane surface, a layer having an extremely non-uniform film thickness, or a two-layered structure where the small particles or the island-like growth region of ferromagnetic material and a nonmagnetic material layer are stacked. A magnetization free layer may also include a layer having a nonmagnetic material layer and ferromagnetic material small particles present in a nonmagnetic metal as a solid solution.

The tri-layered film of FIG. 17A has the small particles 601a of $Co_9Fe_1$ contacting the dielectric layer 607 of $AlO_x$ and the $Ni_3Co_3Fe_4$ layer 603 separated from the dielectric layer 607 of $AlO_x$. The small particles 601a of $Co_9Fe_1$ has relatively high coercive force, while the layer 603 of $Ni_3Co_3Fe_4$ has lower coercive force and high spin-polarization than the $Co_9Fe_1$, whereby, as a magnetization free film, the tri-layered film contributing to a small switching field as well as a large TMR amplitude.

To attain the small switching field as well as the large TMR amplitude, a magnetization free film of the above-described embodiments may have a ferromagnetic material contacting a dielectric tunnel layer of high spin-polarization compared to a ferromagnetic material disposed apart from the dielectric tunnel layer. For a single tunnel junction device, the multi-layered film of layers 601a, 601b, 602 and 603 is an appropriate magnetization free film.

Figure 19:
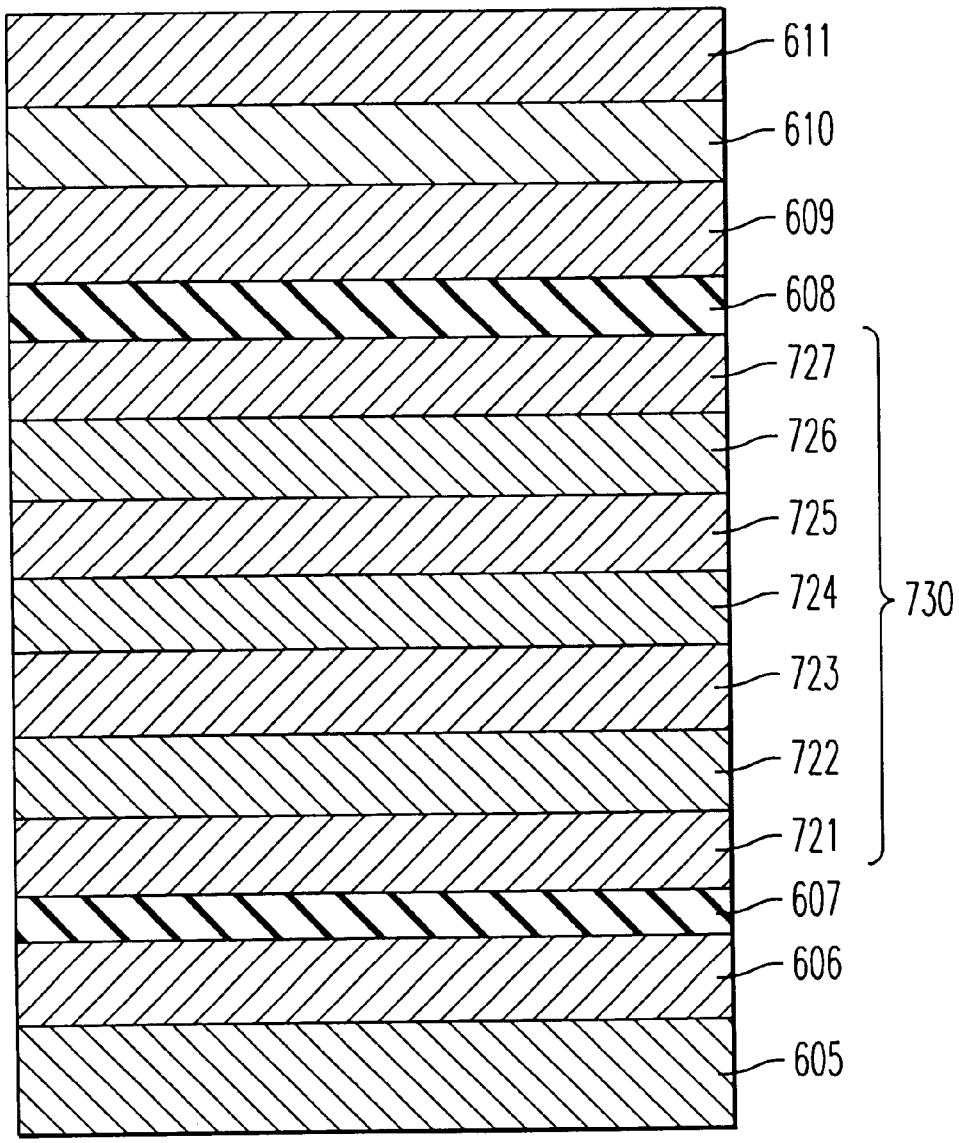
FIG. 19 is a cross-sectional view of a double tunnel junction magnetoresistance effect device according to other embodiment of the present invention.

Further, although the multi-layered film of layers 601a, 601b, 602 and 603 is applicable as the magnetization free film of double tunnel junction in FIG. 17A, a film 730 including a $NiCo_9Fe$ layer 721, a $Ni_4Fe_6$ layer 722, a Cu layer 723, a $Ni_3Co_3Fe_4$ layer 724, a Cu layer 725, a $Ni_4Fe_6$ layer 726 and a $NiCo_9Fe$ layer 727 of FIG. 19 can be used as the magnetization free film of the double junction TMR device of the above-described embodiments.

In the magnetization free film 730, two $NiCo_9Fe$ layers 721 and 727 are contacting respective dielectric tunnel layers 607 and 708, whereby contributing to attain a high TMR amplitude. The $Ni_3Co_3Fe_4$ layer 724, which is disposed apart from the two dielectric tunnel layers 607 and 708, has a coercive force relatively lower than those of the $NiCo_9Fe$ layers 721 and 727, whereby lowering the switching magnetic field. In the above description, $NiCo_9Fe$ shows $Ni_xCo_9Fe_{(1-x)}$, where x is not less than 0.1 and not more than 0.9. Further, the $NiCo_9Fe$ layers 721 and 727 may be formed in the shape of particles or islands.

The magnetoresistance effect device having the memory layer not only shows excellent functionality as a memory device but also can be fabricated inexpensively with small characteristic dispersion and with excellent yield. Further, the structure of the magnetoresistance effect device having the memory film/layer is suitable for miniaturization and therefore, the integration degree of MRAM integrated therewith as memory cells can considerably be increased.

The magnetoresistance effect device according to the above-described first through seventh embodiments can be used in a memory cell of a magnetic memory apparatus by being coupled with known semiconductor integration technology. The magnetic memory apparatus is an integrated memory apparatus which is nonvolatile, having a random access and rewritable.

The magnetoresistance effect device according to the first through the seventh embodiments can constitute a magnetoresistance effect head reproducing magnetic information and can be applied to several head structures, such as a shield structure, a yoke structure, a flux guide structure or their equivalents. The magnetoresistance effect head can be mounted onto a magnetic information reproducing apparatus, such as a magnetic hard disc drive. In this way, a magnetoresistance effect head or a magnetic disc apparatus, is provided with fast signal response speed and excellent properties.

Figure 20:
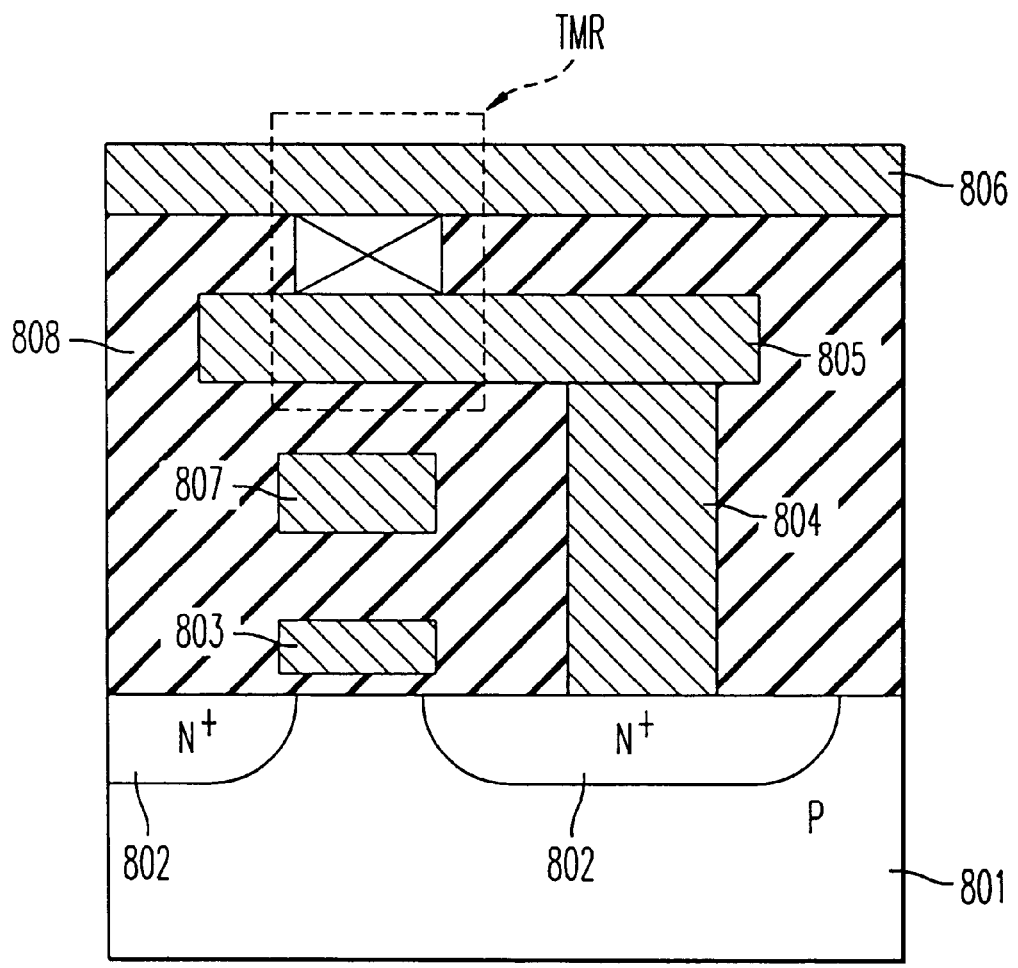
FIG. 20 is a cross-sectional view of a memory cell structure according to a eighth embodiment of the present invention.

FIG. 20 is a cross-sectional view of memory cell of a magnetic memory apparatus (MRAM) using the magnetoresistance effect device according to the first through the seventh embodiments.

An MOS transistor is formed on a P-type silicon substrate 801. The MOS transistor includes $N^+$ source/drain regions 802 formed at a main surface of P-type silicon substrate 801, a gate electrode 803 formed above an N-channel region between the N+ source and drain regions, and a gate insulating film interposed between the gate electrode 803 and the P-type silicon substrate 801. A conductive plug 804 is formed on the silicon substrate 801 and coupled to either one of the source/drain regions 802.

The TMR of one of the embodiments indicated by a broken line, is coupled with a lower electrode 805, which is also coupled to the one of source/drain regions 802 via the conductive plug 804, and a bit line 806 formed parallel to a paper surface of FIG. 20. The bit line is an upper electrode. A word line 807 is formed between the gate electrode 803 and the lower electrode 805 in a direction orthogonal to the paper surface of FIG. 20. An interlayer insulating film 808 is disposed to prevent unnecessary electrical connection between some of these components. A plurality of bit lines are formed in parallel to the bit line 806, and plurality of word lines are formed in parallel to the word line 807, while a TMR device is disposed at each intersection of the bit lines and word lines.

The magnetic information is written by electrical current flows of about 1 mA each through the bit line 806 and the word line 807, those lines are orthogonal to each other and the TMR device disposed at the cross point of the lines can receive current magnetic field produce by the current flow, whereby the magnetization of the magnetization free film would be inverted/rotated. An address decoder selects appropriate current applied to the bit line 806 and the word line 807. When the magnetic field generated by the current at the intersection exceeds a magnitude of a switching magnetic field of the TMR device, the magnetization of the TMR device at the intersection inverts/rotates, while other TMR devices do not receive enough magnetic fields to produce magnetization inversion.

The stored magnetic information can be read by measuring the electrical resistance of the TMR device in correspondence with a direction of magnetization of the ferromagnetic free film. The TMR device to be read is selected among the plurality of TMR devices by using the MOS transistor as a switching transistor.

A circuit or structure of a memory cell described above is an example and there may be many equivalents. For example, several layers and components of the devices are to described to be formed "on" previous layer/component; however, there may be modifications, such ash additional layers inserted between the layers formed on each other.

According to the invention, there can be provided the magnetoresistance effect device having small coercive force and small switching magnetic field. According to the present invention, a memory device having high integration, low power consumption and high-speed reading and writing performance can be realized.

While the present invention has been particularly shown and described with reference to preferred embodiments thereof, it will be understood by those skilled in the art that various other changes in the form and details may be made therein without departing from the spirit and scope of the invention.

What is claimed as new and desired to be secured by Letters Patent of the U.S. is:

1. A magnetoresistance effect device, comprising:
    a first ferromagnetic material layer having a magnetization free to change in an applied magnetic field;
    a first nonmagnetic material coupling layer formed on the first ferromagnetic material layer;
    a second ferromagnetic material layer formed on the first nonmagnetic material layer and having a magnetization free to change in the applied magnetic field, the first and the second ferromagnetic material layers being antiferromagnetically coupled at a magnetic coupling field J, where the magnetic coupling field J satisfies following equation, $-3\ [\text{kOe}] \leq J < 0\ [\text{kOe}]$;
    a first nonmagnetic material spacer layer formed on the second ferromagnetic material layer; and
    a third ferromagnetic material layer formed on the first nonmagnetic material spacer layer and having a magnetization substantially fixed in the applied magnetic field.

2. The magnetoresistance effect device of claim 1, wherein the first ferromagentic material layer comprises a first ferromagnetic material portion, the second ferromagnetic material layer comprises a second ferromagnetic material portion contacting the first nonmagnetic material spacer layer, and the first ferromagnetic material portion has a weaker coercive force than the second ferromagnetic material portion.

3. The magnetoresistance effect device of claim 1, further comprising:
    a second nonmagnetic material spacer layer disposed on the first ferromagnetic material layer to interpose the first ferromagnetic material layer between the first and second nonmagnetic material spacer layers; and
    a fourth ferromagnetic material layer disposed on the second nonmagnetic material spacer layer and having a magnetization substantially fixed in the applied magnetic field.

4. The magnetoresistance effect device of claim 3, further comprising:
    a second nonmagnetic material coupling layer formed between the first ferromagnetic material layer and the second nonmagnetic material spacer layer; and
    a fifth ferromagnetic material layer disposed between the second nonmagnetic material coupling layer and the second nonmagnetic material spacer layer and antiferromagnetically coupled with the first ferromagnetic material layer, wherein, the first ferromagnetic material layer comprises a first ferromagnetic material portion, the second ferromagnetic material layer comprises a second ferromagnetic material portion contacting the first nonmagnetic material spacer layer, the fifth ferromagnetic material layer has a fifth ferromagnetic material portion contacting the second nonmagnetic material spacer layer, and the first ferromagnetic material portion has a weaker coercive force than the second and fifth ferromagnetic material portions.

5. The magnetoresistance effect device of claim 3, wherein the first and the second nonmagnetic material spacer layers comprise dielectric material.

6. The magnetoresistance effect device of claim 5, wherein one of the first through the fourth ferromagnetic material layers has an average thickness of not less than 0.1 nanometer and not more than 100 nanometers.

7. The magnetoresistance effect device of claim 5, wherein one of the first and the second nonmagnetic material spacer layers has an average thickness of not less than 0.1 nanometer and not more than 100 nanometers.

8. A magnetoresistance effect device, comprising:
    a first ferromagnetic material layer having a magnetization free to change in an applied magnetic field;
    a first nonmagnetic material coupling layer formed on the first ferromagnetic material layer;

a second ferromagnetic material layer formed on the first nonmagnetic material layer and having a magnetization free to change in the applied magnetic field, the first and the second ferromagnetic material layers being ferromagnetically coupled;

a first nonmagnetic material spacer layer formed on the second ferromagnetic material layer; and a third ferromagnetic material layer formed on the first nonmagnetic material spacer layer and having a magnetization substantially fixed in the applied magnetic field.

9. The magnetoresistance effect device of claim 8, wherein the first and the second ferromagnetic material layers being ferromagnetically coupled at a magnetic coupling field J, where the magnetic coupling field J satisfies following equation, 0 [kOe]<J≦1 [kOe].

10. The magnetoresistance effect device of claim 8, further comprising:

a second nonmagnetic material spacer layer disposed on the first ferromagnetic material layer to interpose the first ferromagnetic material layer between the first and second nonmagnetic material spacer layers; and a fourth ferromagnetic material layer disposed on the second nonmagnetic material spacer layer and having a magnetization substantially fixed in the applied magnetic field.

11. The magnetoresistance effect device of claim 10, wherein the first and the second nonmagnetic material spacer layers comprise dielectric material.

12. The magnetoresistance effect device of claim 10, wherein one of the first through the third ferromagnetic material layers has an average thickness of not less than 0.1 nanometer and not more than 100 nanometers.

13. The magnetoresistance effect device of claim 10, wherein one of the first and the second nonmagnetic material spacer layers has an average thickness of not less than 0.1 nanometer and not more than 100 nanometers.

14. A magnetoresistance effect device, comprising:

a first ferromagnetic material layer comprising a center region having a first magnetization, and edge regions having a second magnetization different from the first magnetization, the first magnetization being free to change in an applied magnetic field;

a first nonmagnetic material coupling layer disposed on the first ferromagnetic material layer;

a second ferromagnetic material layer disposed on the first nonmagnetic material coupling layer and comprising a center region having a third magnetization parallel to the first magnetization and edge regions having a fourth magnetization different from the third magnetization, the third magnetization being free to change in the applied magnetic field;

a first nonmagnetic material spacer layer formed on the second ferromagnetic material layer; and a third ferromagnetic material layer disposed on the first nonmagnetic material spacer layer and having a magnetization substantially fixed in an applied magnetic field.

15. The magnetoresistance effect device of claim 14, wherein the first and the second ferromagnetic material layers are magnetically coupled at a magnetic coupling field J, where the magnetic coupling field J satisfies following equation −3 [kOe]≦J≦1 [kOe].

16. The magnetoresistance effect device of claim 14, further comprising:

a second nonmagnetic material spacer layer disposed on the first ferromagnetic material layer to interpose the first ferromagnetic material layer between the first and second nonmagnetic material spacer layers; and a fourth ferromagnetic material layer disposed on the second nonmagnetic material spacer layer and having a magnetization substantially fixed in the applied magnetic field.

17. The magnetoresistance effect device of claim 16, wherein the first and the second nonmagnetic material spacer layers comprise dielectric material layers.

18. The magnetoresistance effect device of claim 16, wherein one of the first through the third ferromagnetic material layers has an average thickness of not less than 0.1 nanometer and not more than 100 nanometers.

19. The magnetoresistance effect device of claim 16, wherein one of the first and the second nonmagnetic material spacer layers has an average thickness of not less than 0.1 nanometer and not more than 100 nanometers.

20. A magnetoresistance effect device, comprising:

a first ferromagnetic material layer having a magnetization free to change in an applied magnetic field;

a first nonmagnetic material coupling layer formed on the first ferromagnetic material layer;

a second ferromagnetic material layer formed on the first nonmagnetic material layer and having a magnetization free to change in the applied magnetic field, wherein a roughness at an interface between the first ferromagnetic material layer and the first nonmagnetic material coupling layer or an interface between the second ferromagnetic material layer and the first nonmagnetic material coupling layer is more than 2 angstroms;

a first nonmagnetic material spacer layer formed on the second ferromagnetic material layer; and a third ferromagnetic material layer formed on the first nonmagnetic material spacer layer and having a magnetization substantially fixed in the applied magnetic field.

21. The magnetoresistance effect device of claim 20, further comprising:

a second nonmagnetic material spacer layer disposed on the first ferromagnetic material layer to interpose the first ferromagnetic material layer between the first and second nonmagnetic material spacer layers; and a fourth ferromagnetic material layer disposed on the second nonmagnetic material spacer layer and having a magnetization substantially fixed in the applied magnetic field.

22. The magnetoresistance effect device of claim 21, wherein the first and the second nonmagnetic material spacer layers comprise dielectric material.

23. The magnetoresistance effect device of claim 21, wherein one of the first through the third ferromagnetic material layers has an average thickness of not less than 0.1 nanometer and not more than 100 nanometers.

24. The magnetoresistance effect device of claim 21, wherein one of the first and the second nonmagnetic material spacer layers has an average thickness of not less than 0.1 nanometer and not more than 100 nanometers.

25. A magnetoresistance effect device, comprising:

a magnetization free layer comprising a nonmagnetic material layer and ferromagnetic material portions and having a magnetization free to change in an applied magnetic field, the ferromagnetic material portions being ferromagnetically coupled to each other;

a nonmagnetic material spacer layer disposed on the magnetization free layer; and a ferromagnetic material layer disposed on the nonmagnetic material spacer layer and having a magnetization substantially fixed in the applied magnetic field.

26. The magnetoresistance effect device of claim 25, wherein the ferromagnetic material portions have an average thickness of not less than 0.3 nanometers and not more than 3 nanometers.

27. A magnetoresistance effect device, comprising: a plurality of ferromagnetic material portions ferromagnetically coupled to each other and having a magnetization free to change in an applied magnetic field;
 a nonmagnetic material spacer layer disposed on the magnetization free layer; and
 a ferromagnetic material layer disposed on the nonmagnetic material spacer layer and having a magnetization substantially fixed in the applied magnetic field.

28. The magnetoresistance effect device of claim 27, wherein the ferromagnetic material portions have an average thickness of not less than 0.3 nanometers and not more than 3 nanometers.

29. A magnetoresistance effect device, comprising:
 a magnetization free layer comprising a nonmagnetic material layer and a first ferromagnetic material layer and having a magnetization free to change in an applied magnetic field, the first ferromagnetic material layer having a non-uniform film thickness;
 a nonmagnetic material spacer layer disposed on the magnetization free layer; and
 a second ferromagnetic material layer disposed on the nonmagnetic material spacer layer and having a magnetization substantially fixed in the applied magnetic field.

30. The magnetoresistance effect device of claim 29, wherein the first ferromagnetic material layer has a first point whose film thickness is not more than 1 nanometer and a second point whose film thickness is thicker than the film thickness of the first portion by 30%.

* * * * *